(12) United States Patent
Kriman et al.

(10) Patent No.: US 8,592,233 B2
(45) Date of Patent: Nov. 26, 2013

(54) SUBSTRATE FOR INTEGRATED MODULES

(76) Inventors: Moshe Kriman, Tel-Aviv (IL); Hagit Avsian, Charlotte, NC (US)

( * ) Notice: Subject to any disclaimer, the term of this patent is extended or adjusted under 35 U.S.C. 154(b) by 61 days.

(21) Appl. No.: 13/428,378

(22) Filed: Mar. 23, 2012

(65) Prior Publication Data

US 2013/0023072 A1    Jan. 24, 2013

(30) Foreign Application Priority Data

Jul. 19, 2011    (KR) .................. 10-2011-0071416

(51) Int. Cl.
*H01L 21/00*    (2006.01)

(52) U.S. Cl.
USPC ................... 438/28; 257/E25.032

(58) Field of Classification Search
USPC ............ 438/23–28; 257/E25.032, E33.056
See application file for complete search history.

(56) References Cited

U.S. PATENT DOCUMENTS

| | | |
|---|---|---|
| 6,288,443 B1 | 9/2001 | Finn et al. |
| 6,492,599 B1 | 12/2002 | Sugihara |
| 6,597,053 B1 | 7/2003 | Anthofer et al. |
| 6,836,612 B2 | 12/2004 | Morris et al. |
| 6,934,460 B2 | 8/2005 | Morris et al. |
| 7,867,817 B2 | 1/2011 | Dobritz et al. |
| 2006/0210234 A1 | 9/2006 | Shiv et al. |
| 2007/0287265 A1 | 12/2007 | Hatano et al. |
| 2008/0038868 A1 | 2/2008 | Leib |
| 2010/0164036 A1 | 7/2010 | Kim |
| 2010/0173453 A1 | 7/2010 | Leedy |
| 2011/0181854 A1 | 7/2011 | Ovrutsky et al. |
| 2011/0304930 A1 | 12/2011 | Welch et al. |

FOREIGN PATENT DOCUMENTS

| | | |
|---|---|---|
| JP | 2010177568 A | 8/2010 |
| KR | 20000057511 A | 9/2000 |
| KR | 20050074042 A | 7/2005 |
| KR | 20070113991 A | 7/2005 |
| KR | 20010030385 | 9/2006 |
| KR | 840501 A | 6/2007 |
| KR | 100752198 B1 | 8/2007 |
| KR | 100870652 B1 | 11/2008 |
| KR | 101034634 | 6/2010 |
| KR | 1020110001182 | 1/2011 |
| WO | 2010086936 A1 | 8/2010 |

OTHER PUBLICATIONS

International Search Report dated Oct. 16, 2012, in International Application No. PCT/US2012/030254.

*Primary Examiner* — Shaun Campbell
(74) *Attorney, Agent, or Firm* — Lerner, David, Littenberg, Krumholz & Mentlik, LLP

(57) ABSTRACT

A method of fabricating a plurality of components using wafer-level processing can include bonding first and second wafer-level substrates together to form a substrate assembly, such that first surfaces of the first and second substrates confront one another, the first substrate having first electrically conductive elements exposed at the first surface thereof, forming second electrically conductive elements contacting the first conductive elements, and processing the second substrate into individual substrate elements. The second conductive elements can extend through a thickness of the first substrate and can be exposed at a second surface thereof opposite the first surface. The processing can include trimming material to produce the substrate elements at least some of which have respective different controlled thicknesses between first surfaces adjacent the first substrate and second surfaces opposite therefrom.

47 Claims, 11 Drawing Sheets

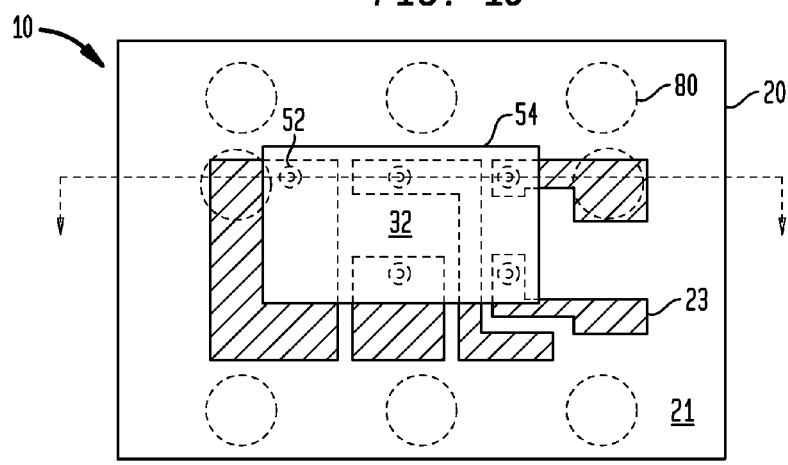
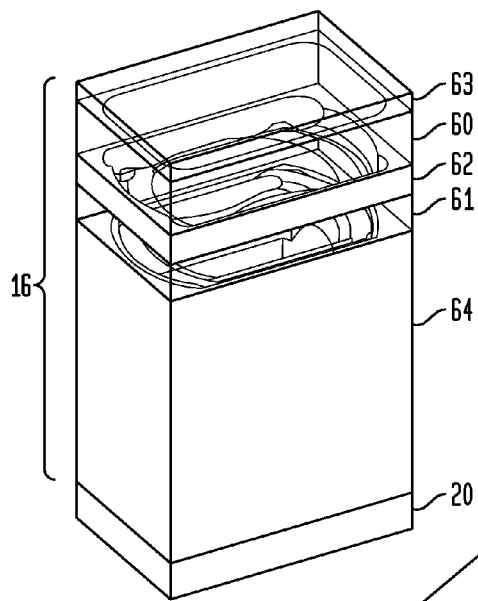
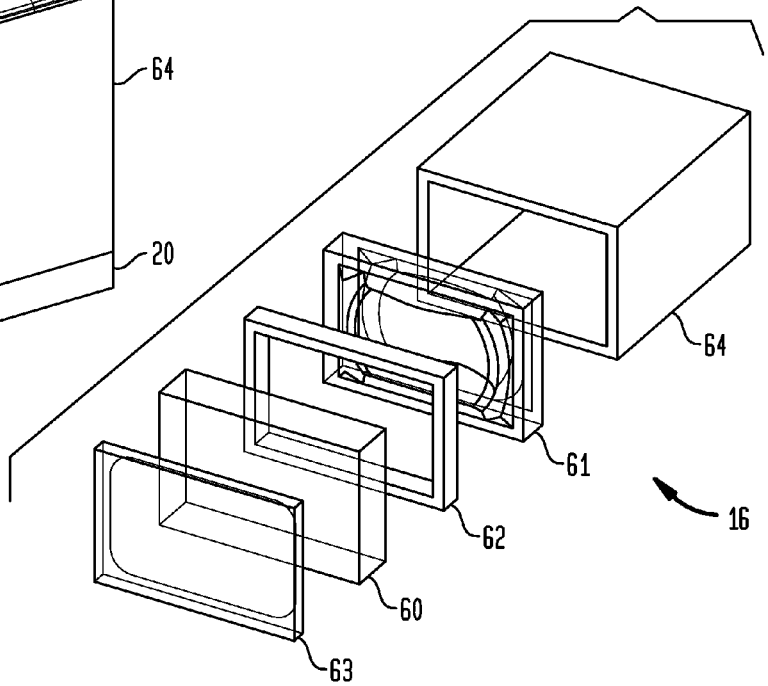

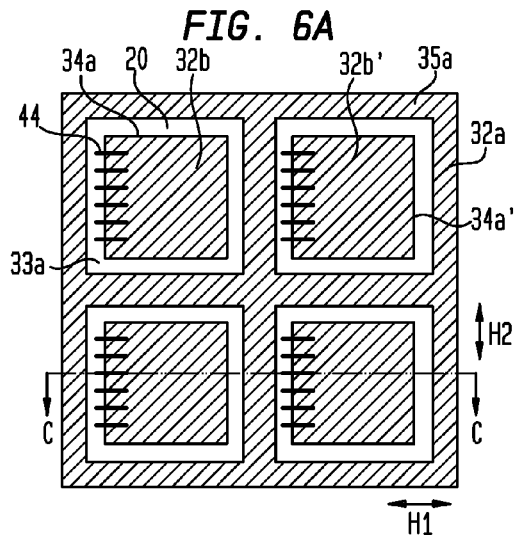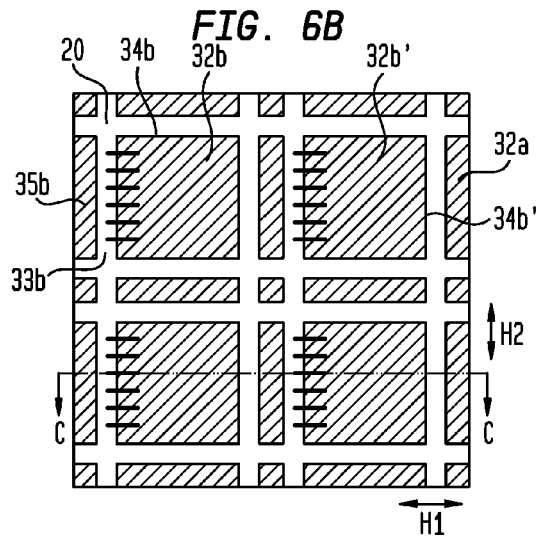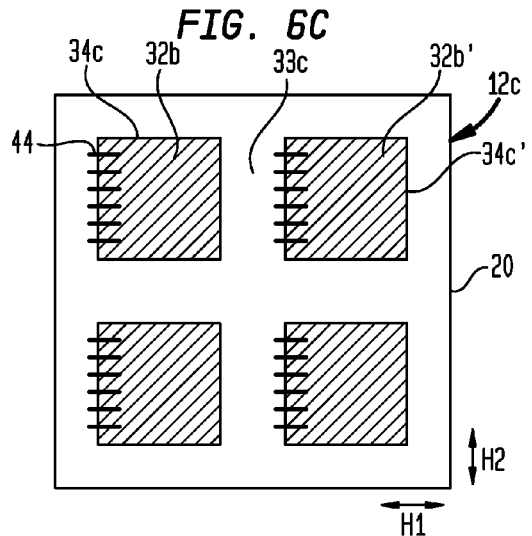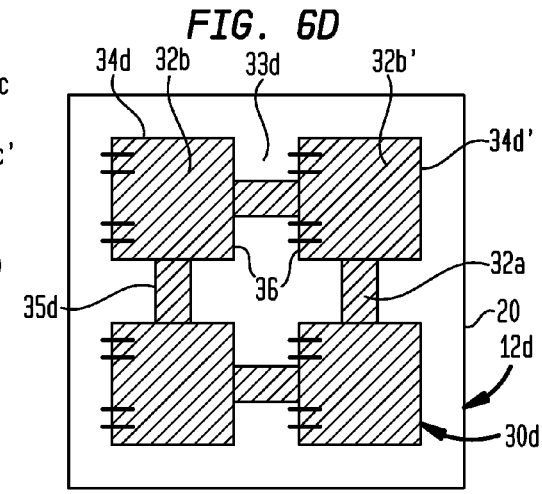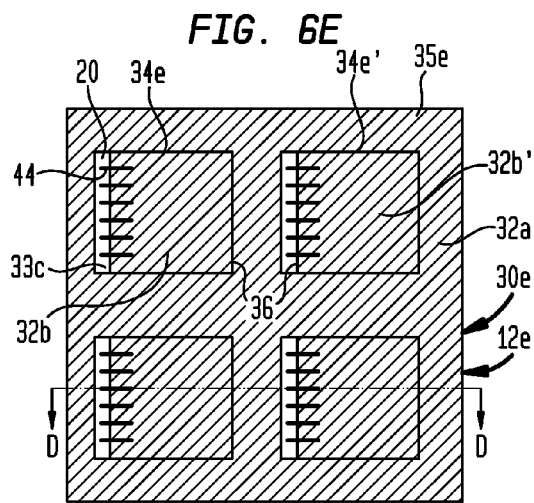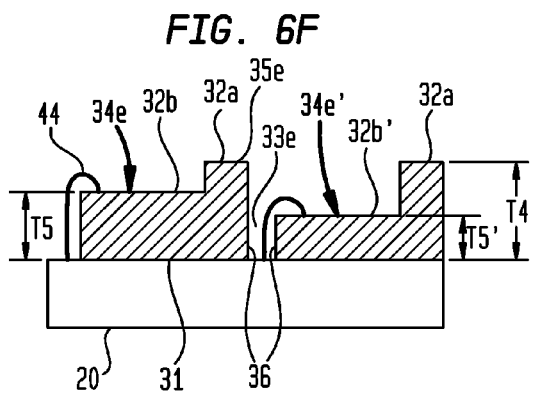

SUBSTRATE FOR INTEGRATED MODULES

CROSS-REFERENCE TO RELATED APPLICATION

This application claims the benefit of the filing date of Korean Patent Application Serial No. 10-2011-0071416, filed Jul. 19, 2011, the disclosure of which is hereby incorporated herein by reference.

BACKGROUND OF THE INVENTION

The present invention relates to bench substrates, e.g., semiconductor bench substrates, integrated modules including such substrates, methods of making such bench substrates and integrated modules, and to components useful in such bench substrates and integrated modules.

Bench substrates are commonly used for mounting thereon of optoelectronic devices such as projectors, photodetectors, and other related optical components. Such components can be assembled to become an integrated module for use in consumer electronics devices such as cameras, cell phones, computers, and gaming systems.

Traditionally, integrated modules having a bench substrate and optoelectronic devices mounted thereon are fabricated as individual units. Achieving desired optical performance, particularly focusing of the output from optoelectronic emitters of respective individual units, has been the subject of much industry effort.

Further improvements would be desirable in the design and fabrication process of integrated modules including bench substrates and optoelectronic devices.

BRIEF SUMMARY OF THE INVENTION

In accordance with an aspect of the invention, a method of fabricating a plurality of components using wafer-level processing can include bonding first and second wafer-level substrates together to form a substrate assembly, such that first surfaces of the first and second substrates confront one another, the first substrate having first electrically conductive elements exposed at the first surface thereof. The method can also include forming second electrically conductive elements contacting the first conductive elements, the second conductive elements extending through a thickness of the first substrate and being exposed at a second surface thereof opposite the first surface. The method can also include processing the second substrate into individual substrate elements, the processing including trimming material to produce the substrate elements at least some of which have respective different controlled thicknesses between first surfaces adjacent the first substrate and second surfaces opposite therefrom.

In a particular embodiment, each individual substrate element can be disconnected from any other substrate element in lateral directions parallel to the first surface of the first substrate. In one embodiment, the method can also include mounting a plurality of optoelectronic devices onto the second surfaces of the respective substrate elements and electrically connecting each optoelectronic device with at least one of the first conductive elements.

In accordance with another aspect of the invention, a method of fabricating a plurality of components using wafer-level processing can include bonding first and second wafer-level substrates together to form a substrate assembly, such that first surfaces of the first and second substrates confront one another, the first substrate having first electrically conductive elements exposed at the first surface thereof. The method can also include forming second electrically conductive elements contacting the first conductive elements, the second conductive elements extending through a thickness of the first substrate and being exposed at a second surface thereof opposite the first surface. The method can also include processing the second substrate to define a plurality of portions thereof, wherein at least some of the first electrically conductive elements are exposed between respective portions, wherein oppositely-facing adjacent edges of adjacent portions are spaced apart from one another, the processing including trimming material to produce the portions, at least some of which portions have respective different controlled thicknesses between first surfaces adjacent the first substrate and second surfaces opposite therefrom.

In an exemplary embodiment, the method can also include mounting a plurality of optoelectronic devices onto the second surfaces of the respective portions and electrically connecting each optoelectronic device with at least one of the first conductive elements. In a particular embodiment, the second substrate can consist essentially of semiconductor material. In one embodiment, the first substrate can consist essentially of semiconductor material. In an exemplary embodiment, the second substrate can consist essentially of monocrystalline or polycrystalline silicon. In a particular embodiment, the second substrate can consist essentially of a material having a coefficient of thermal conductivity that is greater than 100 W/mK. In one embodiment, at least two of said second conductive elements can be available to simultaneously carry first and second different electric potentials, respectively.

In an exemplary embodiment, the step of processing the second substrate into individual substrate elements can include removing material from the second substrate such that at least one of the first conductive elements are at least partially exposed at the second surface of the second substrate for electrical interconnection with another element. In one embodiment, the step of removing material from the second substrate can include forming notches extending through the second substrate and extending parallel to one another. In a particular embodiment, the method can also include the step of etching material exposed within the notches until said first conductive elements are at least partially exposed.

In a particular embodiment, the method can also include the step of removing material from the first substrate to form at least one through hole extending between the first and second surfaces thereof, such that the step of forming the second conductive elements forms the second conductive elements extending within the at least one through hole. In an exemplary embodiment, the step of removing material from the first substrate to form at least one through hole can form a first opening and a second opening within each through hole, the first opening extending from the first surface towards the second surface and the second opening extending from the first opening to the second surface. In one embodiment, inner surfaces of the first and second openings can extend in first and second directions relative to the first surface, respectively.

In an exemplary embodiment, the step of removing material from the first substrate to form at least one through hole can form a plurality of first openings including the first opening within each through hole, each of the plurality of first openings extending from the first surface to the second opening. In one embodiment, the method can also include forming a ball grid array exposed at the second surface of the first substrate for electrical interconnection with one or more additional components external to the plurality of components, such that the ball grid array is electrically connected with the second conductive elements. In a particular embodiment, each optoelectronic device can include a projector unit. In an exemplary embodiment, each optoelectronic device can include a photodetector unit. In one embodiment, each projector unit can include an optoelectronic emitter, a photodetector unit, and a reflective element. In a particular embodiment, each projector unit can include at least one laser and at least one mirror.

In a particular embodiment, the method can also include the step of assembling the substrate assembly with a wafer-level optical assembly having a plurality of optical units, each optical unit overlying a respective optoelectronic device of the plurality of optoelectronic devices. In one embodiment, the wafer-level optical assembly can include a refractive wafer. The step of assembling the substrate assembly with the optical assembly can include assembling at least one spacer extending between the substrate assembly and the optical assembly.

In one embodiment, the method can also include the step of dicing the substrate assembly and the optical assembly to separate each of the plurality of components from one another, such that each of the plurality of components includes a respective part of each of the substrate assembly and the optical assembly. In a particular embodiment, the step of dicing the substrate assembly and the optical assembly can be performed such that each of the plurality of separated components includes at least a part of one of the second conductive elements extending along an edge surface of the first substrate extending between the first and second surfaces of the first substrate. In one example, the step of processing the second substrate into individual substrate elements can include reducing the thickness of one or more of the individual substrate elements using one or more of the following processes: dicing, machining, etching, cutting, polishing, lithographically ablating, and step and repeat replication techniques.

In accordance with another aspect of the invention, a component can include a substrate assembly, first and second electrically conductive elements, and an optoelectronic device. The substrate assembly can include first and second substrates, the first and second substrates bonded together such that the first surfaces of the first and second substrates confront one another. Each substrate can consist essentially of a material having a coefficient of thermal expansion of less than 10 ppm/° C. The first electrically conductive elements can be exposed at the first surface of the first substrate. The second electrically conductive elements can contact the first conductive elements and can be exposed at a second surface of the first substrate opposite the first surface thereof. The optoelectronic device can be mounted onto the second surface of the second substrate and can be electrically connected with at least one of the first conductive elements.

In a particular embodiment, the first and second substrates can consist essentially of semiconductor material. In one embodiment, at least two of said second conductive elements can be available to simultaneously carry first and second different electric potentials, respectively. In an exemplary embodiment, at least one of the first conductive elements can be at least partially exposed at the second surface of the second substrate for electrical interconnection with another element. In a particular embodiment, the optoelectronic device can be electrically connected with at least one of the first conductive elements with wire bonds. In one embodiment, the optoelectronic device can include a projector unit. In an exemplary embodiment, the optoelectronic device can include a photodetector unit.

In one embodiment, the projector unit can include an optoelectronic emitter, a photodetector unit, and a reflective element. In a particular embodiment, the projector unit can include at least one laser and at least one mirror. In an exemplary embodiment, the first substrate can further include at least one through hole extending between the first and second surfaces thereof, and the second conductive elements can extend within the at least one through hole. In one embodiment, each through hole can include a first opening and a second opening, the first opening extending from the first surface towards the second surface and the second opening extending from the first opening to the second surface. In a particular embodiment, inner surfaces of the first and second openings can extend in first and second directions relative to the first surface, respectively. In an exemplary embodiment, each through hole can include a plurality of first openings including said first opening, each of the plurality of first openings extending from the first surface to the second opening.

In an exemplary embodiment, the component can also include an optical unit overlying the optoelectronic device. In one embodiment, the optical unit can include a refractive element. The component can also include at least one spacer extending between the substrate assembly and the optical unit. In a particular embodiment, at least a portion of one of the second conductive elements can extend between the first and second surfaces of the first substrate through a thickness thereof. In an exemplary embodiment, at least a portion of one of the second conductive elements can extend along an edge surface of the first substrate extending between the first and second surfaces of the first substrate. In one embodiment, the component can also include a ball grid array exposed at the second surface of the first substrate for electrical interconnection with one or more additional components external to the component, the ball grid array being electrically connected with the second conductive elements.

In one example, the second surface of the second substrate can have a surface roughness that is different from a surface roughness of another surface of the second substrate or of the substrate assembly. In a particular example, a surface roughness of the second surface of the second substrate can be different from a surface roughness of the second surface of a mounting portion of the substrate assembly, the second surface of the second substrate and the second surface of the mounting portion being disposed at different distances from the first surface of the second substrate in a direction of a thickness of the second substrate.

In accordance with yet another aspect of the invention, an in-process wafer-level component assembly can include a substrate assembly including a first substrate and a plurality of substrate elements, and first and second electrically conductive elements. Each substrate element can be bonded to the first substrate such that a first surface of the substrate element confronts a first surface of the first substrate. The first substrate and each substrate element can consist essentially of a material having a coefficient of thermal expansion of less than 10 ppm/° C. The first electrically conductive elements can be exposed at the first surface of the first substrate. The second electrically conductive elements can contact the first conductive elements. The second conductive elements can extend through a thickness of the first substrate and can be exposed at a second surface thereof opposite the first surface. At least some of the substrate elements can have respective different controlled thicknesses between the first surfaces thereof and second surfaces opposite therefrom.

In one embodiment, each individual substrate element can be disconnected from any other substrate element in lateral directions parallel to the first surface of the first substrate. In an exemplary embodiment, the assembly can also include a plurality of optoelectronic devices each mounted onto the second surface of a respective substrate element and electrically connected with at least one of the first conductive elements. In a particular embodiment, at least one of the first conductive elements can be at least partially exposed at the second surface of a corresponding one of the substrate elements for electrical interconnection with another element.

In accordance with still another aspect of the invention, an in-process wafer-level component assembly can include a substrate assembly including first and second substrates bonded to one another such that first surfaces of the first and second substrates confront one another, first electrically conductive elements exposed at the first surface of the first substrate, and second electrically conductive elements contacting the first conductive elements. Each substrate can consist essentially of a material having a coefficient of thermal expansion of less than 10 ppm/° C. The second conductive elements can extend through a thickness of the first substrate and can be exposed at a second surface thereof opposite the first surface. The second substrate can define a plurality of portions thereof, at least some of which portions have respective different controlled thicknesses between the first surface of the second substrate and respective second surfaces of the portions opposite therefrom. At least some of the first electrically conductive elements can be exposed between respective portions. Oppositely-facing adjacent edges of adjacent portions can be spaced apart from one another.

In an exemplary embodiment, the assembly can also include a plurality of optoelectronic devices each mounted onto the second surface of a respective portion of the second substrate and electrically connected with at least one of the first conductive elements. In one embodiment, at least one of the first conductive elements can be at least partially exposed at the second surface of a corresponding one of the portions of the second substrate for electrical interconnection with another element.

In a particular embodiment, the first and second substrates can consist essentially of semiconductor material. In one embodiment, at least two of said second conductive elements can be available to simultaneously carry first and second different electric potentials, respectively. In one embodiment, the first substrate can also include at least one through hole extending between the first and second surfaces thereof. The second conductive elements can extend within the at least one through hole. In an exemplary embodiment, each through hole can include a first opening and a second opening, the first opening extending from the first surface towards the second surface and the second opening extending from the first opening to the second surface.

In an exemplary embodiment, inner surfaces of the first and second openings can extend in first and second directions relative to the first surface, respectively. In one embodiment, each through hole can include a plurality of first openings including said first opening, each of the plurality of first openings extending from the first surface to the second opening. In one embodiment, the in-process wafer-level component assembly can also include a ball grid array exposed at the second surface of the first substrate for electrical interconnection with components external to the assembly, the ball grid array being electrically connected with the second conductive elements.

In a particular embodiment, each optoelectronic device can include a projector unit. In one embodiment, each optoelectronic device can include a photodetector unit. In an exemplary embodiment, each projector unit can include an optoelectronic emitter, a photodetector unit, and a reflective element. In one embodiment, each projector unit can include at least one laser and at least one mirror. In a particular embodiment, each optoelectronic device can be electrically connected with at least one of the first conductive elements with wire bonds.

In a particular embodiment, the in-process wafer-level component assembly can also include a wafer-level optical assembly assembled to the substrate assembly and having a plurality of optical units, each optical unit overlying a respective optoelectronic device of the plurality of optoelectronic devices. In an exemplary embodiment, the wafer-level optical assembly can include a refractive wafer. The in-process wafer-level component assembly can also include at least one spacer extending between the substrate assembly and the optical assembly.

Further aspects of the invention provide systems which incorporate silicon bench structures according to the foregoing aspects of the invention, integrated modules according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIG. 1C is a top-down plan view that can correspond to one of the components shown in FIG. 1A.

FIG. 1D is a perspective view that can correspond to one of the components shown in FIG. 1A.

FIG. 1E is an exploded perspective view of the optical assembly shown in FIG. 1D.

FIGS. 6A-6E are alternative top-down plan views illustrating substrate assemblies in accordance with embodiments of the invention.

FIG. 6F is a sectional view that can correspond to the substrate assemblies depicted in FIG. 6E, taken through the line D-D of FIG. 6E.

DETAILED DESCRIPTION

Figure 1A:
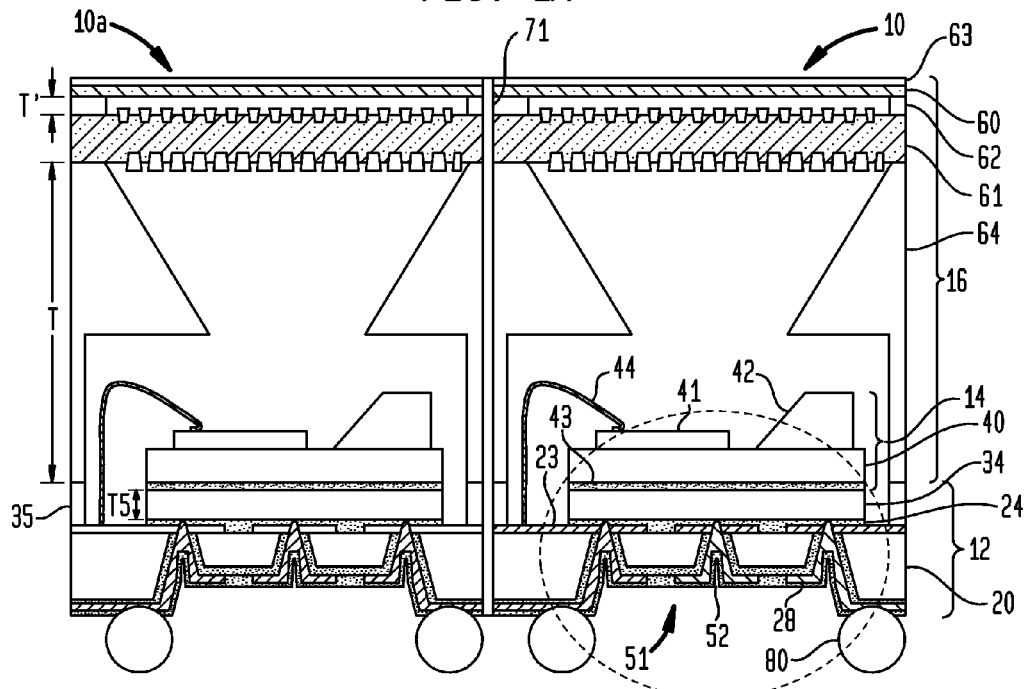
FIG. 1A is a sectional view illustrating two components in accordance with an embodiment of the invention.
Figure 1B:
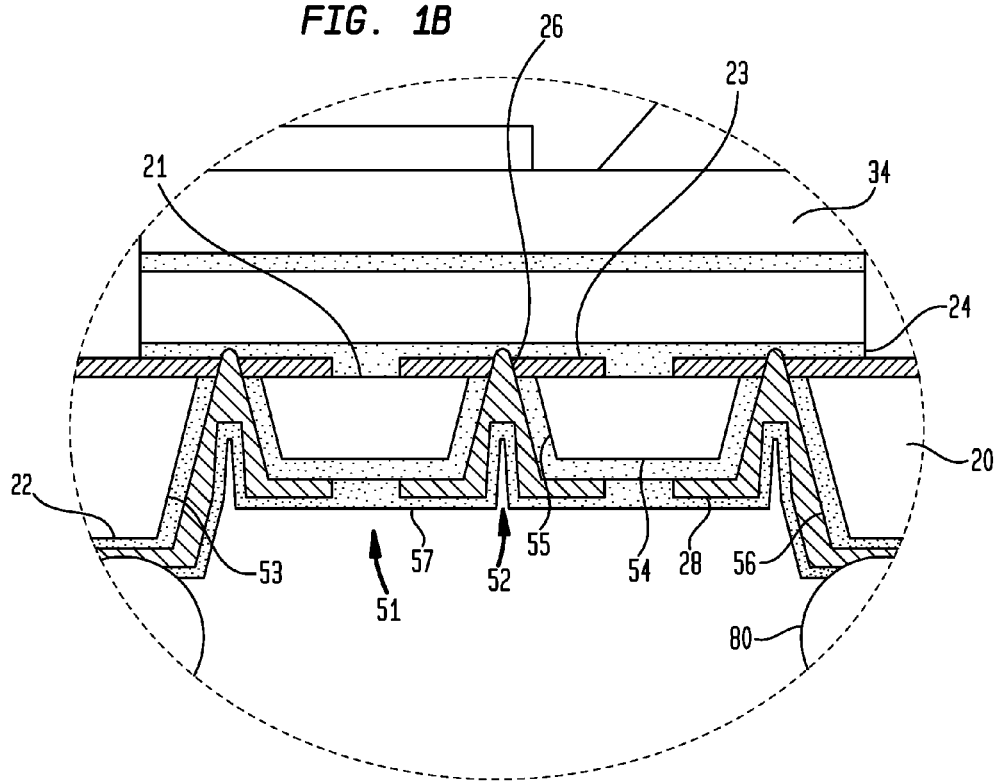
FIG. 1B is an enlarged partial sectional view of a portion of the first substrate shown in FIG. 1A.

With reference to FIGS. 1A-1E, a component 10 according to an embodiment of the present invention includes a substrate assembly 12, an optoelectronic device or micro module assembly 14 mounted onto the substrate assembly, and an optical unit 16 overlying the optoelectronic device.

The substrate assembly 12 includes a first substrate 20 and a second substrate or substrate element 34, the first and second substrates bonded together such that the first surfaces 21 and 31 of the respective first and second substrates confront one another. The first and second substrates 20 and 34 have respective second surfaces 22 and 32 opposite the respective first surfaces 21 and 31. The first and second substrates 20 and 34 can be bonded together with an adhesive layer 24 that can include a non-conductive adhesive material such as an epoxy. In a particular example, the adhesive layer 24 can have a thickness of 1-2 microns.

Each substrate 20 and 34 can consist essentially of a material having a coefficient of thermal expansion ("CTE") less than $10*10^{-6}/°$ C. (or ppm/° C.). In a particular embodiment, each substrate 20 and 34 can have a CTE less than $7*10^{-6}/°$ C. Each substrate 20 and 34 can consist essentially of a material having a coefficient of thermal conductivity that is greater than 100 W/mK. For example, each substrate 20 and 34 can consist essentially of a semiconductor material, such as silicon, which can have a coefficient of thermal conductivity of approximately 150 W/mK. In exemplary embodiments, monocrystalline or polycrystalline silicon can be used for each substrate 20 and 34. In a particular example, aluminum nitride can be used for each substrate 20 and 34, which can have a coefficient of thermal conductivity of between approximately 140 and approximately 180 W/mK. In one example wherein the first substrate 20 consists essentially of silicon, the first substrate can contain embedded components such as resistors, capacitors, or transistors (not shown).

In FIG. 1A, the directions parallel to the first surface 21 of the first substrate are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The first substrate 20 can include a first opening 51 extending from the second surface 22 partially through the first substrate towards the first surface 21, and one or more second openings 52 extending from the first opening to the first surface 21. A first opening 51 and a corresponding second opening 52 can be considered to be a through hole extending through a thickness of the first substrate 20 between the first and second surfaces 21 and 22.

Each first opening 51 and second opening 52 can have any top-view shape, including for example, circular, oval, square, rectangular (i.e., channel-shaped), or other more complex shapes. In a particular example, the first opening 51 can be a rectangular channel with a plurality of second openings 52 extending therefrom, as shown in FIG. 1A. In some examples, each first opening 51 and second opening 52 can have any three-dimensional shape, including for example, a cylinder, a cube, a prism, or a frustoconical shape, among others.

The inner surface 53 of each first opening 51 and the inner surface 55 of each second opening 52 can extend at the same or different angles relative to the second surface 22. Preferably, the inner surfaces 53 and 55 extend through the first substrate 20 at an angle between 0 and 90 degrees to the horizontal plane defined by the second surface 22.

The inner surface 53 of each first opening 51 and the inner surface 55 of each second opening 52 may be sloped, i.e., may extend at angles other a normal angle (right angle) to the exposed surface, as shown in FIG. 1A. Wet etching processes, e.g., isotropic etching processes and sawing using a tapered blade, among others, can be used to form first openings 51 having sloped inner surfaces 53 and second openings 52 having sloped inner surface 55. Laser ablation, mechanical milling, chemical etching, plasma etching, directing a jet of fine abrasive particles towards the first substrate 20, among others, can also be used to form the first openings 51 and second openings 52 (or any other hole or opening described herein) having sloped respective inner surfaces 53 and 55.

Alternatively, instead of being sloped, the inner surface 53 of each first opening 51 and the inner surface 55 of each second opening 52 may extend in a vertical or substantially vertical direction at right angles or substantially at right angles to the exposed surface. Anisotropic etching processes, laser ablation, mechanical removal processes, e.g., milling, ultrasonic machining, directing a jet of fine abrasive particles towards the first substrate 20, among others, can be used to form first openings and second openings 52 having essentially vertical respective inner surfaces 53 and 55.

The inner surfaces 53 and 55 can have a constant slope or a varying slope. For example, the angle or slope of the inner surfaces 53 and 55 relative to the horizontal plane defined by the second surface 22 can decrease in magnitude (i.e., become less positive or less negative) as the inner surfaces 53 and 55 penetrate further towards the first surface 21.

In one embodiment, the inner surfaces 53 and 55 of the respective first and second openings 51 and 52 can extend in first and second directions relative to the second surface 22 of the first substrate 20, respectively. In a particular example, such first and second directions can each define a substantial angle with respect to the second surface 22 of the first substrate 20.

In a particular embodiment, each second opening 52 can extend less than half-way from the first surface 21 of the first substrate 20 towards the second surface 22, such that a height of the second opening 52 in a direction perpendicular to the second surface 22 is less than a height of a corresponding first opening 51.

Any number of second openings 52 can extend from a single first opening 51, and the second openings 52 can be arranged in any geometric configuration within a single first opening 51. For example, three second openings 52 can arranged along a common axis extending from a single first opening 51, as shown in FIG. 1A. Particular examples of various first and second opening configurations and methods of forming these configurations are described in the herein incorporated commonly owned U.S. Patent Application Publication No. 2008/0246136, the disclosure of which is incorporated herein by reference.

The substrate assembly 12 can include a dielectric layer 56 overlying the second surface 22 of the first substrate 20, the inner surfaces 53 and 55 of the respective first and second openings 51 and 52, and the lower surface 54 of the first opening. A dielectric layer (not shown) can overlie the first surface 21. Such a dielectric layer 56 can electrically insulate conductive elements from the first substrate 20. This dielectric layer can be referred to as a "passivation layer" of the first substrate 20. The passivation layer can include an inorganic or organic dielectric material or both. The dielectric layer may include an electrodeposited conformal coating or other dielectric material, for example, a photoimageable polymeric material, for example, a solder mask material.

The substrate assembly 12 can include one or more first electrically conductive elements 23 exposed at the first surface 21 of the first substrate 20. The first conductive elements 23 (and any of the other conductive elements described herein) can be made of metal that may include copper or gold, for example, or the first conductive elements can include one or more other electrically conductive materials such as conductive paste or electrically conductive printed features. At least one of the first conductive elements 23 is at least partially exposed at the second surface 32 of the second substrate 34 for electrical interconnection with another element.

As used in this disclosure, a statement that an electrically conductive element is "exposed at" a surface of a substrate or a dielectric element overlying a surface of the substrate indicates that the electrically conductive element is available for contact with a theoretical point moving in a direction perpendicular to the surface of the substrate toward the surface of the substrate from outside the substrate. Thus, an electrode or other conductive element which is exposed at a surface of a substrate may project from such surface; may be flush with such surface; or may be recessed relative to such surface and exposed through a hole or depression in the substrate.

While essentially any technique usable for forming conductive elements can be used to form the conductive elements described herein, particular techniques as discussed in greater detail in the commonly owned U.S. patent application Ser. No. 12/842,669, filed Jul. 23, 2010, can be employed, which is hereby incorporated by reference herein. Such techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

Each of the first conductive elements 21 (and any of the other conductive elements described herein that are exposed for electrical interconnection with another element) can have any top-view shape, including, for example, a rectangular shape, as shown in FIG. 1C, a circular pad shape, an oval shape, a square shape, a triangular shape, or a more complex shape, such as the polygonal shapes shown in FIG. 1C.

The substrate assembly 12 can include one or more second electrically conductive elements 28 contacting the first conductive elements 23 and exposed at the second surface 22 of the first substrate 20. As shown in FIG. 1A, at least one of the second conductive elements 28 can extend within a corresponding first opening 51 and second opening 52 between a corresponding first conductive element 23 and the second surface 22. At least one of the second conductive elements 28 can be at least partially exposed at the second surface 22 of the first substrate 20 for electrical interconnection with another element. At least one of the second conductive elements 28 can contact a corresponding first conductive element 23 at an inner surface of an aperture 26 extending through the first conductive element. In a particular embodiment, at least two of the second conductive elements 28 can be available to simultaneously carry first and second different electric potentials, respectively. In one embodiment, at least a portion of one of the second conductive elements 28 can extend between the first and second surfaces and 22 of the first substrate 20 through a thickness thereof.

An insulating dielectric layer 57 overlies the second surface 22 of the first substrate 20 and the second conductive elements 28, to provide good dielectric isolation with respect to the first substrate and the second conductive elements. The insulating dielectric layer 57 can include an inorganic or organic dielectric material or both. In a particular embodiment, the insulating dielectric layer 57 can include a compliant dielectric material.

The substrate assembly 12 can include a ball grid array 80 exposed at the second surface 22 of the first substrate 20 for electrical interconnection with one or more additional components external to the component, the ball grid array being electrically connected with the second conductive elements 28.

The ball grid array 80 includes one or more conductive masses. Such conductive masses can comprise a fusible metal having a relatively low melting temperature, e.g., solder, tin, or a eutectic mixture including a plurality of metals. Alternatively, such conductive masses can include a wettable metal, e.g., copper or other noble metal or non-noble metal having a melting temperature higher than that of solder or another fusible metal. Such wettable metal can be joined with a corresponding feature, e.g., a fusible metal feature of an interconnect element. In a particular embodiment, such conductive masses can include a conductive material interspersed in a medium, e.g., a conductive paste, e.g., metal-filled paste, solder-filled paste or isotropic conductive adhesive or anisotropic conductive adhesive.

The optoelectronic device 14 is mounted onto the second surface 32 of the second substrate 34. The optoelectronic device 14 can include a third substrate or sub mounting assembly 40, an optoelectronic emitter such as a laser 41 mounted onto the third substrate, and a reflective element such as a mirror 42 mounted onto the third substrate. The third substrate 40 can be bonded with the second substrate 34, for example, with an adhesive layer 43 that can include an adhesive material such as an epoxy. In a particular embodiment, the laser 41 and the mirror 42 can be adapted to be a projector unit. The optoelectronic device 14 can further include a photodetector unit (not shown) mounted onto the third substrate 40.

The optoelectronic device 14 can be electrically connected with at least one of the first conductive elements 23. As shown in FIG. 1A, the optoelectronic device 14 can be electrically connected with at least one of the first conductive elements 23 with at least one wire bond 44. As shown in FIG. 1A, a particular wire bond 44 can extend between the laser 41 and a first conductive element 23. In a particular embodiment (not shown), each device 14 can be electrically connected with a plurality of conductive elements 23 via a plurality of corresponding wire bonds 44.

In one example (not shown), the optoelectronic device 14 can be electrically connected with at least one of the first conductive elements 23 through a conductive via extending through an opening in the second substrate 34. In such an embodiment, the first conductive elements 23 can be considered to be exposed at the second surface 32 of the second substrate 34 for interconnection with at least one conductive element extending between the first conductive elements and the optoelectronic device 14.

The optical unit 16 is mounted onto the substrate assembly 12 overlying the optoelectronic device 14. The optical unit 16 can include a refractive element 60, a collimating element 61, a first spacer 62 extending between the refractive and collimating elements, a glass cover 63 overlying and protecting the refractive element, and a second spacer 64 extending between the collimating element and the substrate assembly 12.

In the example embodiment wherein the optoelectronic device 14 includes a projector unit, it may be desirable that the refractive element 60 and the collimating element 61 be located at predetermined distances from the optoelectronic device, and in particular, from the mirror 42. Such distances can be selected based on several factors, including the frequency of the laser, and the optical qualities of the refractive element 60 and the collimating element 61. Such selected distances can be achieved by selecting the thickness T of the second spacer 64, the thickness T' of the first spacer 62, and the thickness T5 of the second substrate 34.

In a particular embodiment, as shown in FIG. 1A, the optical unit 16 can be mounted onto mounting portions 35 that are portions of an original substrate from which the second substrate 34 is fashioned. In an example embodiment (not shown), the optical unit 16 can be mounted directly onto the first surface 21 of the first substrate 20, and the thickness T of the second spacer 64 can be increased to compensate for the lack of the mounting portions 35.

Figure 2A:
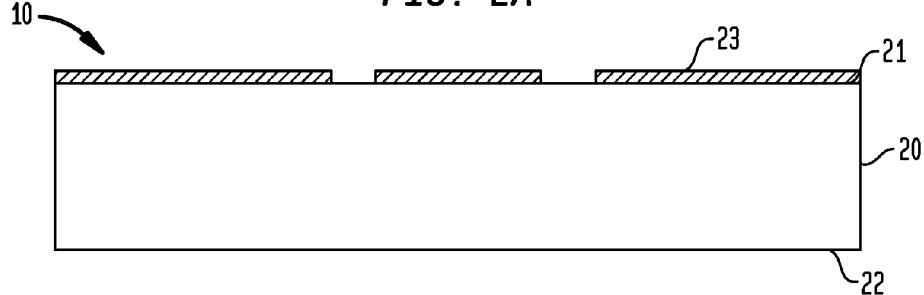
FIGS. 2A-2H are sectional views illustrating stages of fabrication in accordance with the embodiment of the invention depicted in FIG. 1A.

A method of fabricating the component 10 (FIG. 1A) will now be described, with reference to FIGS. 2A-2Q. As illustrated in FIG. 2A, the first substrate 20 begins in a wafer form, such that a plurality of components 10 can be fabricated while attached together and separated from one another at the end of the fabrication process. One or more first conductive elements 23 can be formed overlying the first surface 21 of the first substrate 20, such that the first conductive elements are exposed at the first surface. In a particular embodiment, a passivation layer (not shown) can extend between the first conductive elements 23 and the first surface 21.

To form the first conductive elements 23 (and any of the other conductive elements described herein), an exemplary method involves depositing a metal layer by one or more of sputtering a primary metal layer onto the exposed first surface 21 of the first substrate 20, plating, or mechanical deposition. Mechanical deposition can involve the directing a stream of heated metal particles at high speed onto the surface to be coated. This step can be performed by blanket deposition onto the first surface 21, for example. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the first conductive elements 23 (and any of the other conductive elements described herein). In particular examples, a stack including a plurality of metal layers can be formed on one or more of the aforementioned surfaces. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

Figure 2B:
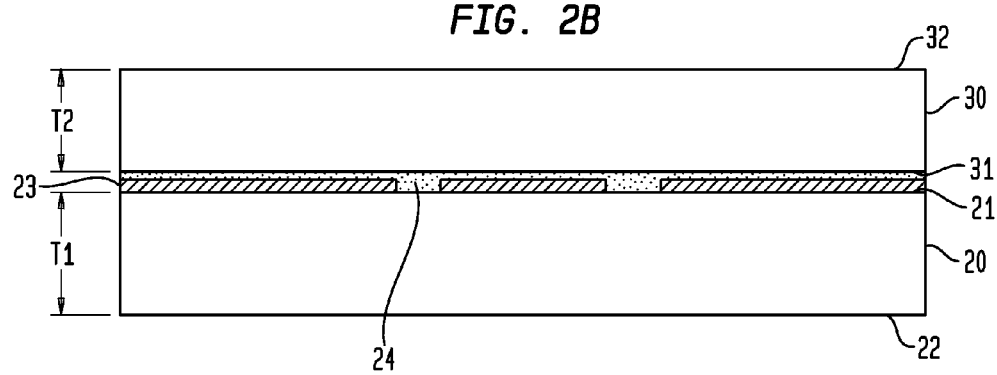

Thereafter, as illustrated in FIG. 2B, the first substrate 20 can be bonded with a second substrate 30, wherein the first and second substrates are both in wafer form. The first and second substrate wafers 20 and 30 can be bonded together with the adhesive layer 24 that can include a non-conductive adhesive material such as an epoxy, such that the respective first surfaces 21 and 31 confront one another. In one embodiment, the adhesive layer 24 can be applied by spin coating.

The first and second substrates 20 and 30 can be bonded together to create the substrate assembly 12.

Figure 2C:
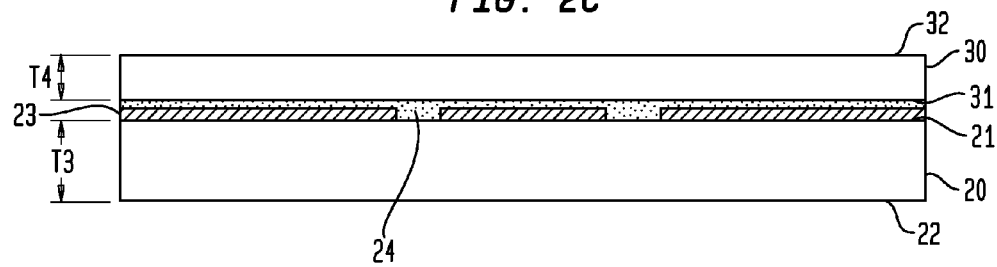

Thereafter, as illustrated in FIG. 2C, the first and second substrates 20 and 30 can each be thinned, for example, by removing substrate material from the respective second surfaces 22 and 32. Grinding, lapping, or polishing of the second surfaces 22 and 32 or a combination thereof can be used to reduce the thickness of the first and second substrates 20 and 30. The first substrate 20 can be thinned from a thickness of T1 (FIG. 2B) to a thickness of T3 (FIG. 2C), and the second substrate 30 can be thinned from a thickness of T2 (FIG. 2B) to a thickness of T4 (FIG. 2C). In a particular example, the first substrate 20 can be thinned to a thickness T3 of approximately 400 microns, and the second substrate 30 can be thinned to a thickness T4 of approximately 200-300 microns.

In the present invention, fabrication of the component 10 using wafer-level first and second substrates 20 and 30 can allow the component to be very thin compared to conventional components including silicon benches (i.e., a very thin first substrate 20) because performing the fabrication steps on wafer-level assemblies according to the invention can provide additional lateral mechanical support for the first substrates 20 during the fabrication process. If the component 10 was fabricated using a component-level process, the first substrate 20 might have to be thicker to provide sufficient mechanical support during fabrication. In consumer electronics applications, it can be advantageous to have a relatively thin silicon bench (e.g., having a T3 of approximately 400 microns or less) for use of the components in hand-held devices, particularly slim-profile hand-held devices.

Figure 2D:
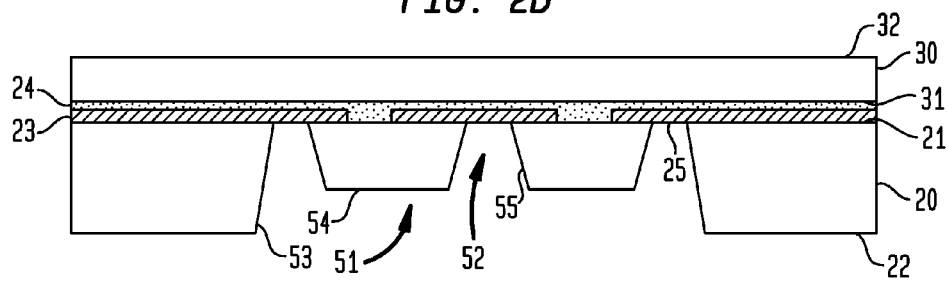

Thereafter, as illustrated in FIG. 2D, the first and second openings 51 and 52 can be formed extending inwardly from the second surface 22 towards the first surface 21 by removing material from the second surface of the first substrate 20, thereby exposing portions of lower surfaces 25 of the first conductive elements 23 within the second openings 52. In a particular embodiment, the inner surfaces 53 and 55 of the respective first and second openings 51 and 52 can be formed such that they extend in first and second directions relative to the second surface 22 of the first substrate 20, respectively.

The openings 51 and 52 can be formed for example, by selectively etching the first substrate 20, after forming a mask layer where it is desired to preserve remaining portions of the second surface 22. For example, a photoimageable layer, e.g., a photoresist layer, can be deposited and patterned to cover only portions of the second surface 22, after which a timed etch process can be conducted to form the first and second openings 51 and 52.

In a particular embodiment, the first opening 51 can be formed first, for example, by an etching process. Then, a mask layer can be applied to portions of the inner surface 53 and the lower surface 54 of the first opening where it is desired to preserve remaining portions thereof. Then, at least one second opening 52 can then be formed extending between a particular first opening 51 and a corresponding first conductive element 23, for example, by an etching process.

Figure 2E:
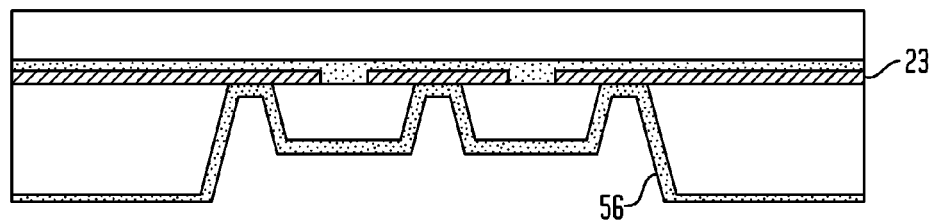

Thereafter, as illustrated in FIG. 2E, the dielectric layer 56 can be formed, overlying the second surface 22 of the first substrate 20, the inner surfaces 53 and 55 of the respective first and second openings 51 and 52, and the lower surface 54 of the first opening. Various methods can be used to form the dielectric layer 56. In one example, a flowable dielectric material is applied to the second surface 22 of the substrate 20, and the flowable material is then more evenly distributed across the exposed surface during a "spin-coating" operation, followed by a drying cycle which may include heating. In another example, a thermoplastic film of dielectric material can be applied to the second surface 22 after which the assembly is heated, or is heated in a vacuum environment, i.e., placed in an environment under lower than ambient pressure. In another example, vapor deposition can be used to form the dielectric layer 56.

In still another example, the assembly including the first substrate 20 can be immersed in a dielectric deposition bath to form a conformal dielectric coating or dielectric layer 56. As used herein, a "conformal coating" is a coating of a particular material that conforms to a contour of the surface being coated, such as when the dielectric layer 56 conforms to a contour of the inner surface 53 of the first opening 50. An electrochemical deposition method can be used to form the conformal dielectric layer 56, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer 56 on exposed surfaces of the substrate which are conductive or semiconductive, including but not limited to along the inner surfaces 53 and 55 of the respective first and second openings 51 and 52. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on a pre-existing passivation layer overlying the second surface 22 of the first substrate 20, due to its dielectric (non-conductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 56 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |
| ECOAT NAME | ELECTROLAC | LECTRASEAL DV494 | LECTROBASE 101 |
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |

TABLE 1-continued

| FILM PROPERTIES | | | |
|---|---|---|---|
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

Figure 2F:
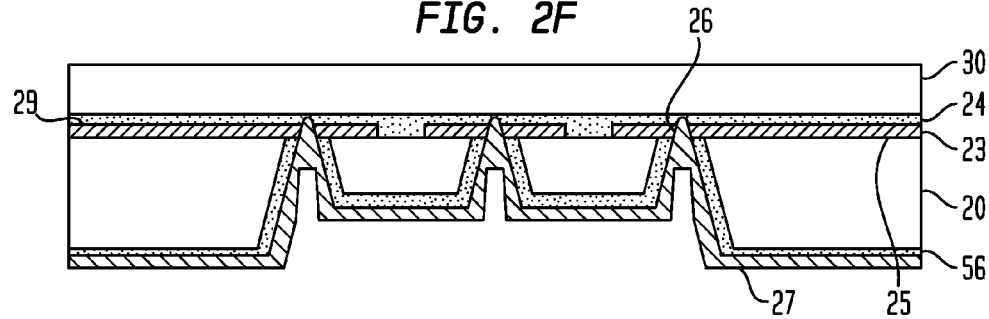

Thereafter, as illustrated in FIG. 2F, a mask layer (not shown) can be deposited onto the dielectric layer 56 where it is desired to preserve remaining portions of the dielectric layer. For example, a photoimageable layer, e.g., a photoresist layer, can be deposited and patterned to cover only portions of the dielectric layer 56. Then, an etch process can be applied to remove portions of the dielectric layer 56 exposed within the mask openings so as to form openings in the dielectric layer overlying the portion of the lower surface 25 of the first conductive elements 23. Then, apertures 26 can be formed that extend from the openings in the dielectric layer 56 through the first conductive elements 23 from the lower surface 25 to the upper surface 29 thereof. As shown, the apertures 26 can extend into the adhesive layer 24. In a particular embodiment (not shown), the apertures 26 can extend to the upper surface 29 of the first conductive elements 23 but may not extend into the adhesive layer 24.

Thereafter, still referring to FIG. 2F, a second electrically conductive element layer 27 can be formed extending through a thickness of the first substrate 20 within a corresponding first opening 51 and second opening 52. The second conductive element layer 27 can be formed in contact with a corresponding first conductive element 23 and can be exposed at the second surface 22 of the first substrate 20. As shown, the second electrically conductive element layer 27 can be formed in contact with a corresponding first conductive element 23 at an inner surface of an aperture 26 extending through the first conductive element. The second conductive element layer 27 can be formed using similar methods as those described above with respect to the first conductive elements 23 (FIG. 2A).

In a particular embodiment (not shown), the etching process can be stopped at the lower surface 25 of the first conductive elements 23, such that apertures do not extend therethrough, or the etching process can be stopped partially through the first conductive elements, such that recesses are formed within the first conductive elements rather than apertures. In such embodiments, the second conductive element layer 27 can be formed extending from the lower surface 25 of the first conductive elements 23 to the second surface 22 of the first substrate 20.

Figure 2G:
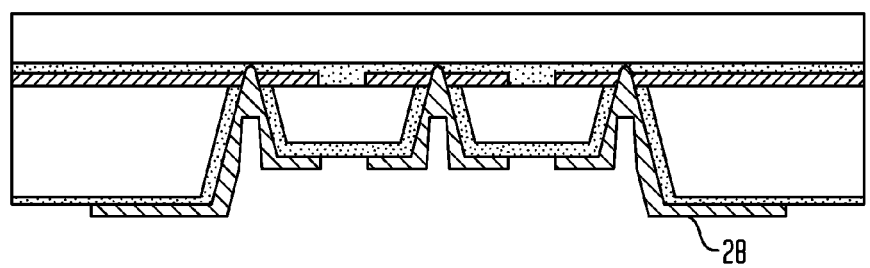

Thereafter, as illustrated in FIG. 2G, an etch process can be applied to a portion of the second conductive element layer 27 exposed at the second surface 22 of the first substrate 20 so as to form the second conductive elements 28 at desired locations along the second surface of the first substrate. Such second conductive elements 28 can include trace portions extending along the second surface 22 and contact portions exposed at the second surface for interconnection with one or more additional components (e.g., via interconnection with the ball grid array 80 as described below with reference to FIG. 2Q).

Figure 2H:
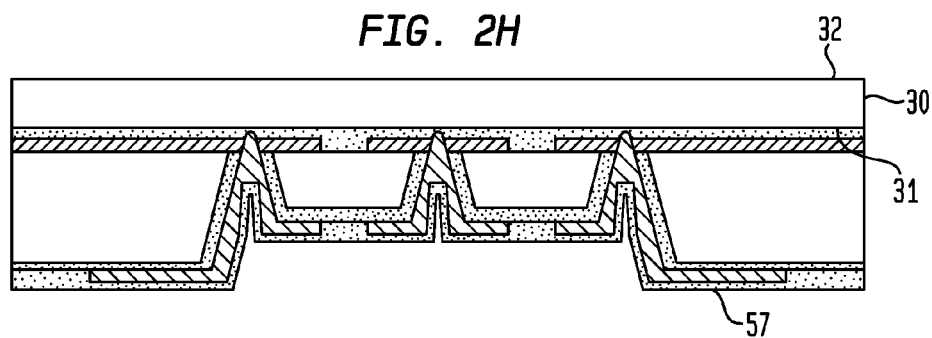
Figure 2J:
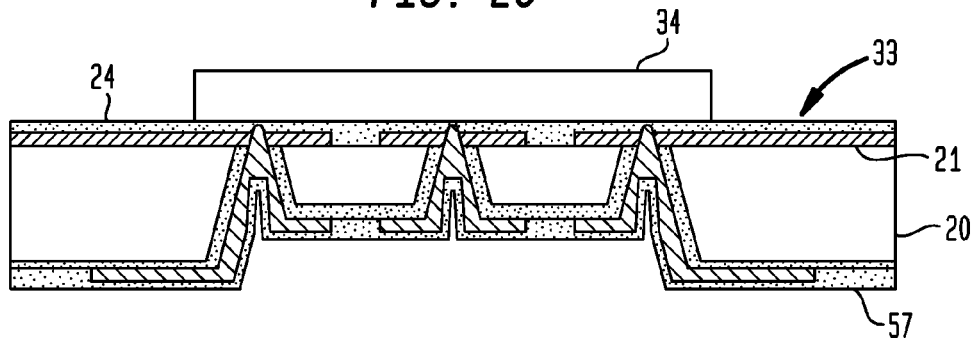
FIGS. 2J-2N are sectional views illustrating further stages of fabrication in accordance with the embodiment of the invention depicted in FIG. 1A.
Figure 2K:
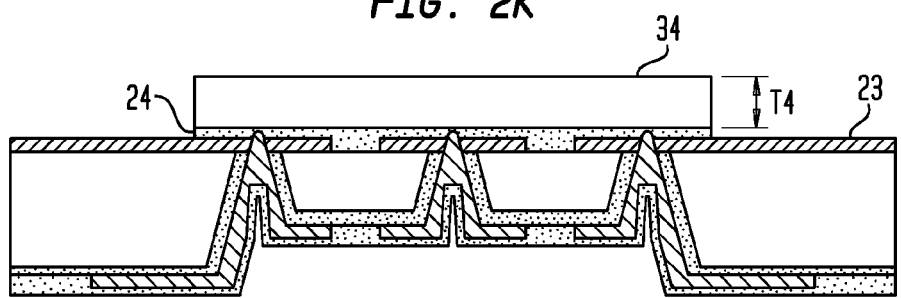
Figure 2L:
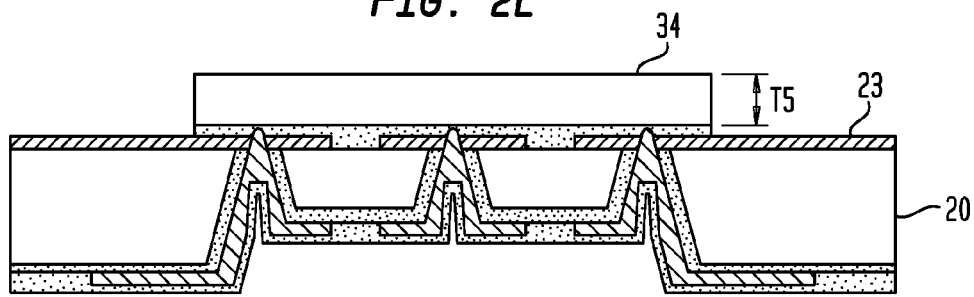
Figure 2M:
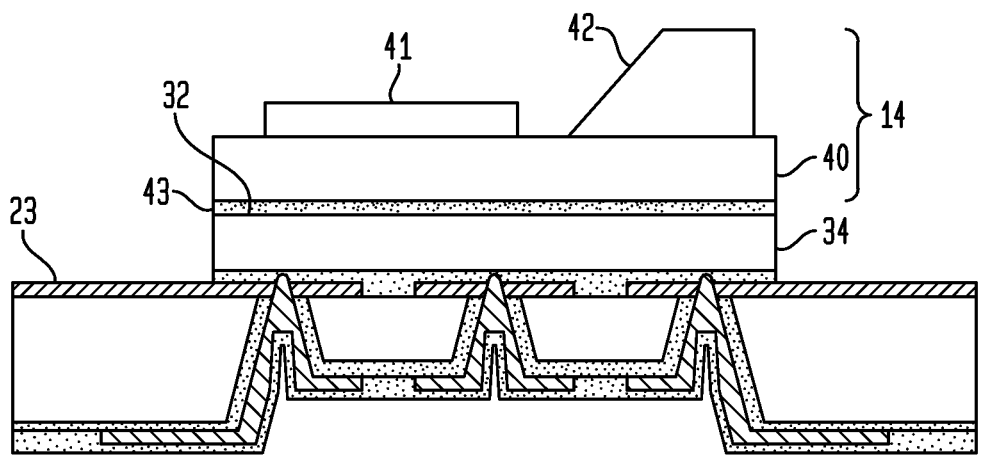
Figure 2N:
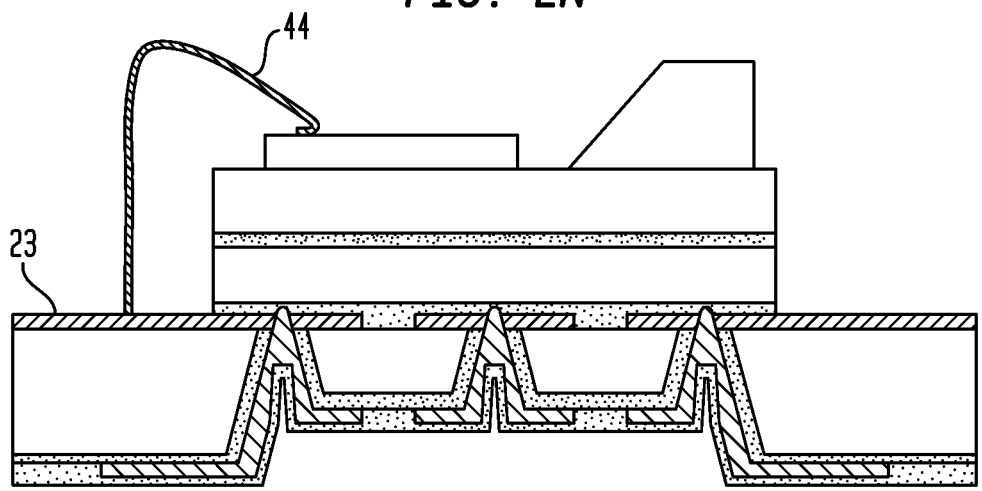
Figure 2P:
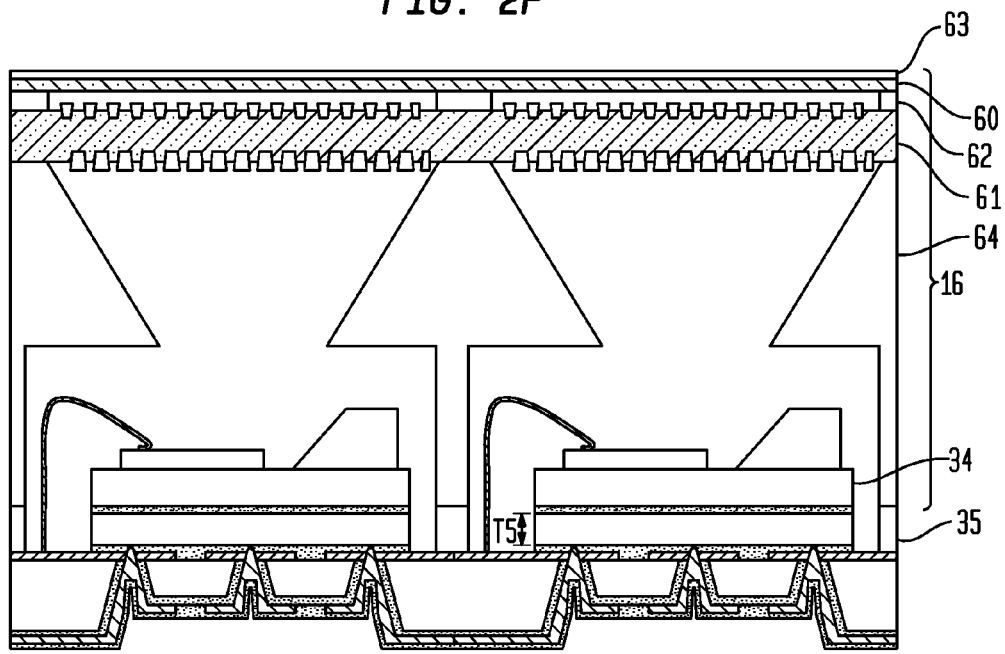
FIGS. 2P-2Q are sectional views illustrating still further stages of fabrication in accordance with the embodiment of the invention depicted in FIG. 1A.
Figure 2Q:
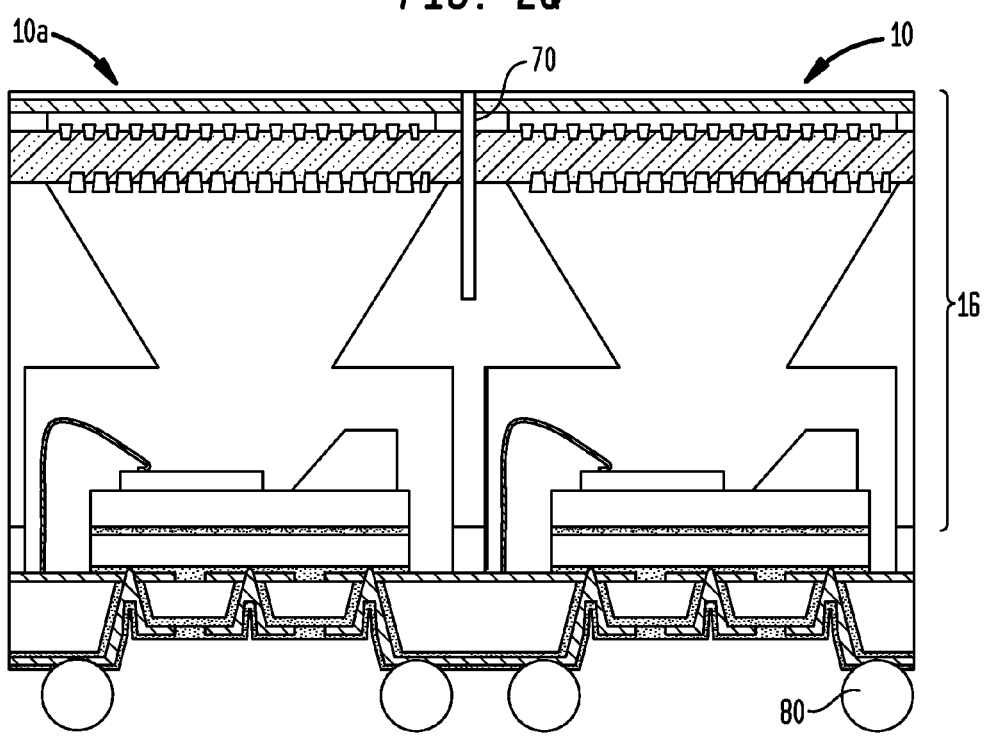

Thereafter, as illustrated in FIG. 2H, the dielectric layer 57 can be formed overlying the second surface of the first substrate 20 and the second conductive elements 28, except at contact portions of the second conductive elements where it is desired to deposit the ball grid array 80 (FIG. 2Q). In a particular embodiment, at least two of the second conductive elements 28 can be at least partially exposed at the dielectric layer 57 such that they are available to simultaneously carry first and second different electric potentials, respectively. The dielectric layer 57 can be formed using similar methods as those described above with respect to the dielectric layer 56 (FIG. 2E).

Thereafter, as illustrated in FIG. 2J, the second substrate wafer 30 can be processed into individual second substrate elements 34, each second substrate element disconnected from any other second substrate element in lateral directions parallel to the first surface 21 of the first substrate 20. In a particular example, the step of processing the second substrate wafer 30 into individual substrate elements 34 includes removing material from the second substrate such that at least one of the first conductive elements 23 are at least partially exposed at the second surface 32 of a corresponding second substrate element 34 for electrical interconnection with another element.

In one example, the step of removing material from the second substrate wafer 30 includes forming notches 33 extending through the second substrate wafer and extending parallel to one another. As used herein, "parallel" refers to axes extending in a direction of the length of the notches 33 being parallel or substantially parallel within an allowed tolerance, even if edges of the "parallel" notches are not entirely parallel.

Such formation of the notches 33 can be performed in multiple steps, including, for example, a first dicing or sawing process to remove most of the material to from the notches, and then etching the remaining material exposed within the target notches until the first conductive elements located at the first surface 21 of the first substrate wafer 20 are at least partially exposed. In a particular embodiment, the step of forming the notches 33 forms individual second substrate elements 34 and mounting portions 35, the mounting portions being located extending across the anticipated dicing lanes 71 such that the optical unit 16 can be mounted thereon (FIG. 2P).

Thereafter, as illustrated in FIG. 2K, if the adhesive layer 24 located within the notches 33 has not already been removed during the step illustrated in FIG. 2J, the adhesive layer can be removed. In an exemplary embodiment, a plasma cleaning process can be used to remove portions of the adhesive layer 24 overlying the first conductive elements 23 within the notches 33.

Thereafter, as illustrated in FIG. 2L, the second substrate elements 34 can be further trimmed to reduce the thickness, for example, from a thickness of T4 (FIG. 2K) to a thickness of T5 (FIG. 2L). At least some of the second substrate elements 34 can be trimmed such that they can have respective different controlled thicknesses T5 between first surfaces 31 adjacent the first substrate 20 and second surfaces 32 opposite therefrom.

The thickness T5 of each particular second substrate element 34 can be selected based on some of the factors discussed above, such as the particular frequency of the laser 41 that will be mounted onto the particular second substrate element, and the optical qualities of the corresponding refractive element 60 and the corresponding collimating element 61 overlying the particular laser 41. In a particular embodiment, a saw such as that used in a dicing process can be used to reduce the thickness of each particular second substrate element 34 from the thickness T4 to the desired thickness T5.

In some embodiments, the thickness of each particular second substrate element 34 can be reduced by one or more of the following processes: dicing, machining, etching, cutting, polishing, lithographically ablating, and step and repeat replication techniques. In a particular example, the process of adjusting the thickness of each particular second substrate element 34 can result in the second surface 32 of one or more of the second substrate elements having a surface roughness that is different from a surface roughness of another surface of the second substrate element or of the substrate assembly 12. For example, in the embodiment shown in FIG. 6A, a surface roughness of the second surface 32b, 32b' of one or more of the respective substrate elements 34a, 34a' can be different from a surface roughness of the second surface 32a of the mounting portions 35a.

Thereafter, as illustrated in FIG. 2M, each optoelectronic device 14 can be mounted onto the second surface 32 of a corresponding second substrate element 34. In one embodiment, each second substrate element 34 can have a particular optoelectronic device 14 mounted thereon that includes a laser 41 that has contributed to the selection of the selected thickness T5 of the particular second substrate element. The third substrate 40 of the optoelectronic device 14 can be bonded with the second substrate element 34 with an adhesive layer 43 that can include a non-conductive adhesive material such as an epoxy.

Thereafter, as illustrated in FIG. 2N, the optoelectronic device 14 can be electrically connected with at least one of the first conductive elements 23 with at least one wire bond 44. A conductive contact of the optoelectronic device 14 can be wire-bonded to a first conductive element 23, for example. In a particular embodiment (not shown), each optoelectronic device 14 can be electrically connected with a plurality of conductive elements 23 via a plurality of corresponding wire bonds 44.

Thereafter, as illustrated in FIG. 2P, a wafer-scale optical assembly 16 can be mounted onto the wafer-scale substrate assembly 12 overlying the optoelectronic devices 14. The optical assembly 16 can include the following wafer-scale components: a refractive element 60, a collimating element 61, a first spacer 62 extending between the refractive and collimating elements, a glass cover 63 overlying the refractive element, and a second spacer 64 extending between the collimating element and the substrate assembly 12. In a particular embodiment, as shown in FIG. 2P, the optical unit 16 can be mounted onto mounting portions 35 that are remaining from the original second substrate 30.

In an exemplary embodiment, the thickness T5 of each individual second substrate element 34 has been chosen to optimize the laser-focusing performance of the portion of the refractive element wafer 60 and the portion of the collimating element wafer 61 overlying the particular optoelectronic device 14 that is mounted to the second substrate element. For example, as described above, the thicknesses T5 of at least some of the substrate elements 34 have been reduced to selected thicknesses during fabrication to achieve this result.

Thereafter, as illustrated in FIG. 2Q, the assembled wafer-scale substrate assembly 12 and optical assembly 16 can begin to be diced to separate each of the plurality of components 10 and 10a from one another. In a particular embodiment, the optical assembly can be diced into individual optical units 16 along partial dicing lanes 70, wherein the partial dicing lanes can extend partially into the second spacers 64. The assembled wafer-scale substrate assembly 12 and optical assembly 16 can be mounted onto a support element such as a dicing tape (not shown) with a temporary adhesive during dicing of the optical assembly into individual optical units along the partial dicing lanes 70, such that portions of the second surface 22 of the first substrate 20 overlie a front surface of the support element.

Thereafter, still referring to FIG. 2Q, the support element can be removed from the second surface 22 of the first substrate 20, and a ball grid array 80 can be formed. The ball grid array 80 can be exposed at the second surface 22 of the first substrate 20 for electrical interconnection with one or more additional components external to the plurality of components 10 and 10a, such that the ball grid array is electrically connected with the second conductive elements 28.

The ball grid array 80 can be deposited onto contact portions of the second conductive elements 28 (described above) such that the conductive masses of the ball grid array can be electrically connected with the second conductive elements 28. In particular alternative embodiments, the ball grid array 80 can be deposited onto the substrate assembly 12 during either of the process steps described with reference to FIG. 2G or 2J.

Thereafter, referring again to FIG. 1A, the assembled wafer-scale substrate assembly 12 and optical assembly 16 can continue to be diced to separate each of the plurality of components 10 and 10a from one another. In a particular embodiment, the optical assembly can continue to be diced into individual components 10 and 10a along dicing lanes 71, wherein the dicing lanes can extend fully through the wafer-scale assemblies. Such dicing can separate each of the plurality of components 10 and 10a from one another, such that each of the plurality of components includes a respective portion of each of the substrate assembly 12 and the optical assembly 16, and each component includes a respective optoelectronic device 14.

The assembled wafer-scale substrate assembly 12 and optical assembly 16 can be inverted and mounted onto a support element such as a dicing tape (not shown) with a temporary adhesive during dicing of the substrate assembly into individual optical units along the dicing lanes 71, such that portions of a top surface of the glass cover 63 overlie a front surface of the support element. After dicing is completed, the individual components 10 and 10a can be removed from the support element.

Figure 3:
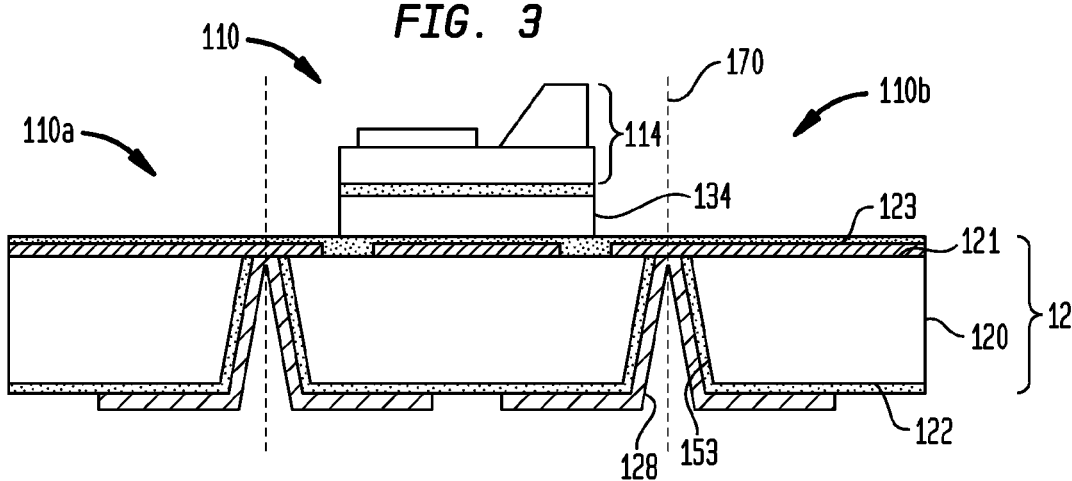
FIG. 3 is a sectional view illustrating a component in accordance with another embodiment.

FIG. 3 illustrates a variation of the component of FIG. 1A having an alternate first substrate configuration. The component 110 is similar to the component 10 described above, except that the component 110 has second electrically conductive elements 128 having portions thereof extending along edge surfaces 153 of the first substrate 120 extending between the first and second surfaces 121 and 122 thereof. Moreover, the component 110 includes two channel-shaped openings 151 extending across respective dicing lanes 170 at either side of the component through which the second conductive elements 128 extend between the first and second surfaces 121 and 122 of the first substrate 120.

A method of fabricating the component 110 (FIG. 3) will now be described, with reference to FIGS. 4A-4E. Fabrication of the component 110 can begin with the process steps illustrated in FIGS. 2A and 2B, in which the first conductive elements are formed onto the first substrate wafer, and the first and second substrate wafers are bonded together.

Figure 4A:
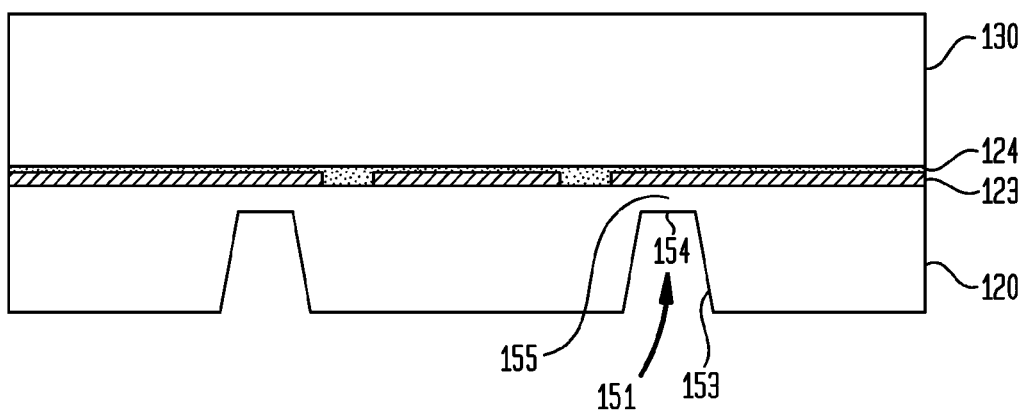
FIGS. 4A-4E are sectional views illustrating stages of fabrication in accordance with the embodiment of the invention depicted in FIG. 3.
Figure 4B:
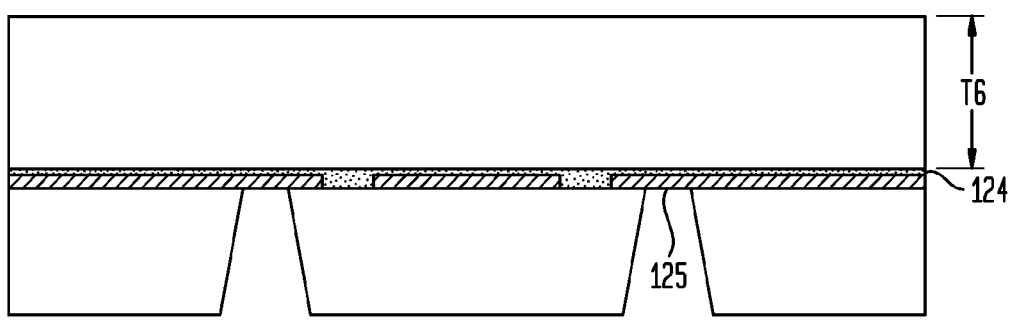

Thereafter, as illustrated in FIGS. 4A and 4B, the openings 151 can be partially formed extending inwardly from the second surface 122 towards the first surface 121 by removing material from the second surface of the first substrate 120, leaving remaining portions 155 (e.g., 20-30 microns thick) between the lower surface 154 and the first surface 121 within the openings (FIG. 4A). In a particular embodiment, a process similar to that described above with reference to forming the notches 33 of FIG. 2J can be used, wherein formation of the openings 151 can be performed in multiple steps, including, for example, a first dicing or sawing process to remove most of the material to from the openings (FIG. 4A), and then etching the remaining portions 155 exposed within openings until the lower surfaces 125 of the first conductive elements 123 located at the first surface 121 of the first substrate wafer 120 are at least partially exposed (FIG. 4B). In an exemplary embodiment, the openings 151 shown in FIGS. 4A and 4B can be cross-sections of channel-shaped openings extending parallel to one another along the second surface 122 of the first substrate wafer 120.

Figure 4C:
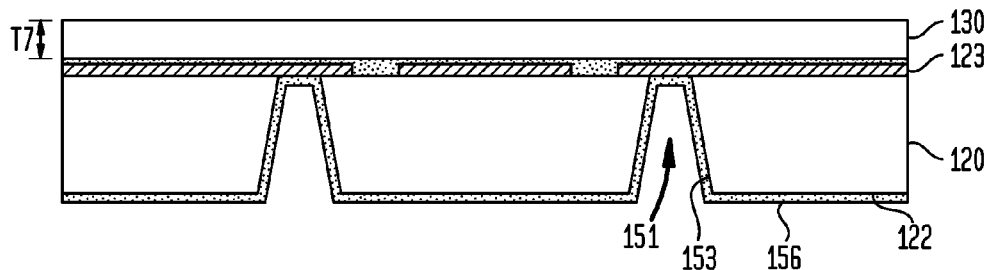

Thereafter, as illustrated in FIG. 4C, a dielectric layer or passivation 156 can be formed, overlying the second surface 122 of the first substrate 120 and the inner surface 153 opening 151. The dielectric layer 156 can be formed using similar methods as those described above with respect to the dielectric layer 56 (FIG. 2E). Furthermore, still referring to FIG. 4C, the second substrate wafer 130 can be thinned, for example, by removing substrate material from the second surface 32. Grinding, lapping, or polishing of the second surface 32 or a combination thereof can be used to reduce the thickness of the second substrate 30. The second substrate 30 can be thinned from a thickness of T6 (FIG. 4B) to a thickness of T7 (FIG. 4C). In a particular example, the second substrate 130 can be thinned to a thickness T7 of approximately 200-300 microns.

Figure 4D:
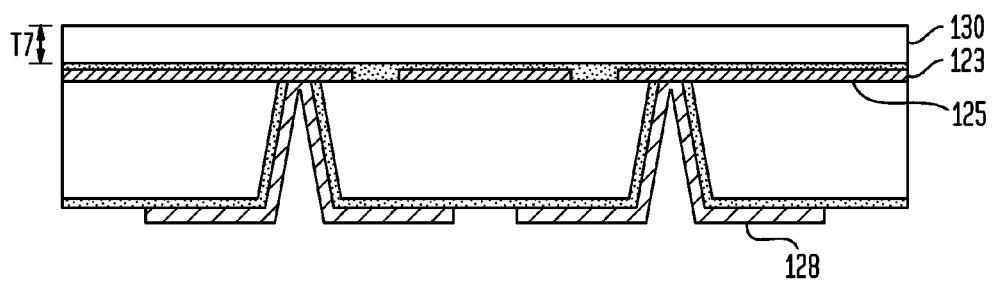

Thereafter, as illustrated in FIG. 4D, an etch process can be applied to the portion of the dielectric layer 156 exposed within mask openings (deposited as described with reference to FIG. 2F) so as to remove the portion of the dielectric layer overlying the portion of the lower surface 125 of the first conductive elements 123 where it is desired to form second conductive elements 128 electrically connecting thereto.

Thereafter, still referring to FIG. 4D, second electrically conductive elements 128 can be formed extending through a thickness of the first substrate 120 within a corresponding opening 151. The second conductive elements 128 can be formed in contact with a corresponding first conductive element 123 and can be exposed at the second surface 122 of the first substrate 120. As shown, the second electrically conductive element elements 128 can be formed in contact with corresponding first conductive elements 123 at lower surfaces 125 thereof. The second conductive elements 128 can be formed using similar methods as those described above with respect to the first conductive elements 23 (FIG. 2A). Such second conductive elements 128 can include trace portions extending along the second surface 122 and contact portions exposed at the second surface for interconnection with one or more additional components (e.g., via interconnection with a ball grid array such as that described above with reference to FIG. 2Q).

Figure 4E:
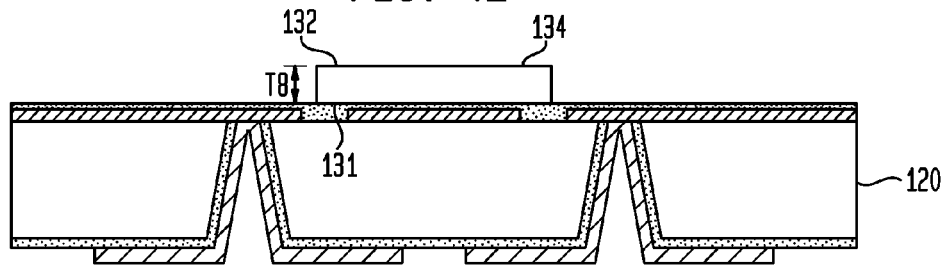

Thereafter, as illustrated in FIG. 4E, the second substrate wafer 130 (FIG. 4D) can be processed into individual second substrate elements 134, each second substrate element disconnected from any other second substrate element in lateral directions parallel to the first surface 121 of the first substrate 120. The process steps of forming notches 133 extending through the second substrate wafer 130 and extending parallel to one another to form the individual second substrate element 134 can be performed using similar methods as those described above with respect to forming the notches 33 (FIG. 2J).

Thereafter, still referring to FIG. 4E, the second substrate elements 134 can be further trimmed to reduce the thickness, for example, from a thickness of T7 (FIG. 4D) to a thickness of T8 (FIG. 4E). At least some of the second substrate elements 134 can be trimmed such that they can have respective different controlled thicknesses T8 between first surfaces 131 adjacent the first substrate 120 and second surfaces 132 opposite therefrom. The thickness T8 of each particular second substrate element 34 can be selected based on some of the factors discussed above with reference to FIG. 1A. In a particular embodiment, a dicing process can be used to reduce the thickness of each particular second substrate element 134 from the thickness T7 to the desired thickness T8.

Thereafter, referring again to FIG. 3, the assembled wafer-scale substrate assembly 112 can be joined with an optical assembly such as the optical assembly 16 shown in FIG. 1A, and the assembled wafer-scale component assembly can be diced to separate each of the plurality of components 110, 110a, and 110b from one another along dicing lanes 170. Such dicing can separate each of the plurality of components 110, 110a, and 110b from one another, such that each component can include a respective portion of each of the substrate assembly 112 and an optical assembly such as the optical assembly 16, and each component can include a respective optoelectronic device 14 described above with reference to FIG. 1A.

Dicing the wafer-scale component assembly along the dicing lanes 170 can produce a plurality of components 110, 110a, and 110b such that each component includes at least a portion of one of the second conductive elements 128 extending along an edge surface 153 of the first substrate 120 extending between the first and second surfaces 121 and 122 thereof. Although the edge surfaces 153 are formed as inner surfaces 153 of the openings 151, when the components 110 are diced through the openings, the inner surfaces 153 become edge surfaces 153 of the first substrate 120, and the resulting routing of the second conductive elements 128 extends along these edge surfaces of the first substrate.

Figure 5:
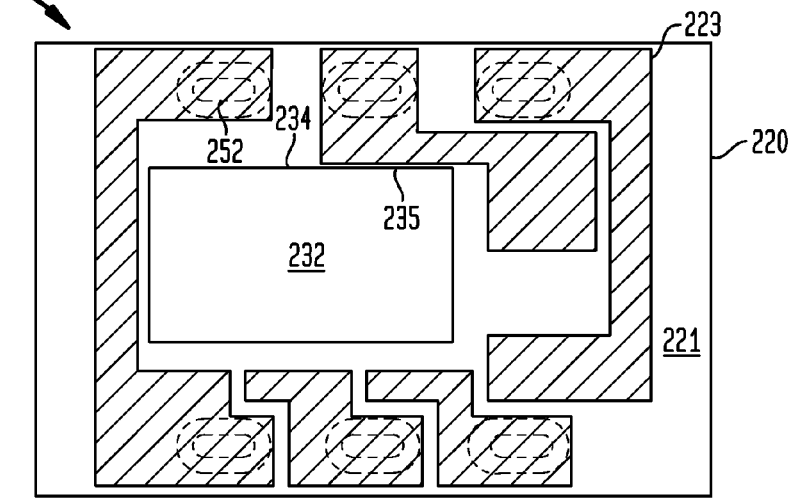
FIG. 5 is a top-down plan view illustrating a component in accordance with yet another embodiment.

FIG. 5 illustrates a variation of the component shown in top-down plan view in FIG. 1C having an alternate configuration of the first conductive elements and the first and second openings. The component 210 is similar to the component 10 described above, except that the component 210 has second openings 252 located laterally outside the edge surfaces 235 of the second substrate element 234, rather than having the second openings underlying the second substrate element (as shown in FIG. 1C. Furthermore, the component 210 has an alternate routing of the first conductive elements 223 along the first surface 221 of the first substrate 220 compared with the embodiment shown in FIG. 1C.

FIGS. 6A-6E are alternative top-down plan views illustrating substrate assemblies in accordance with embodiments of the invention. FIG. 6A shows a plurality of substrate elements 34a and 34a' and mounting portions 35a that can be the substrate elements 34 and the mounting portions 35 shown in FIG. 1A, respectively. The first substrate 20, the substrate elements 34, and the mounting portions 35 of FIG. 1A can be a sectional view of the first substrate 20, the substrate elements 34a and 34a', and the mounting portions 35a of FIG. 6A, taken along the line C-C shown in FIG. 6A.

The substrate elements 34a and 34a' and the mounting portions 35a can be formed from an original second substrate wafer such as the wafer 30 shown in FIGS. 2B-2H. Notches 33a can be formed extending through portions of the second substrate wafer, thereby exposing portions of conductive elements exposed at the first surface of the first substrate 20 (such as the first conductive elements 23 shown in FIG. 1A) for electrical connection with optoelectronic devices (such as the optoelectronic devices 14 shown in FIG. 1A) mounted on second surfaces of the respective substrate elements 34a and 34a' through one or more wire bonds 44.

The notches 33a can be formed in a variety of shapes, which can form the mounting portions 35a having a variety of corresponding shapes at least partially surrounding or extending between the substrate elements 34a and 34a'. In one example, as shown in FIG. 6A, the notches 33a can completely extend around respective substrate elements 34a and 34a', such that the mounting portions 35a form a mesh shape extending across the first surface of the first substrate 20. In a particular embodiment, each individual substrate element 34a and 34a' can be disconnected from any other substrate element in lateral directions H1 and H2 parallel to the first surface of the first substrate 20.

In one embodiment, the mounting portions 35a can have a single common height T4 (FIG. 2C) between a first surface 31 (FIG. 2C) and a second surface 32a, which can be the height of the second substrate wafer 30 before the notches 33a are formed. In a particular example, having mounting portions 35a that have a single common height can provide tighter manufacturing tolerances for the distance between the optoelectronic devices 14 and the optical units 16 overlying the respective optoelectronic devices, compared to example embodiments that do not have mounting portions having a single common height.

In one example, the substrate elements 34a and 34a' can have individual heights T5 (FIG. 1A), such that a first substrate element 34a can have a first height between a first surface 31 (FIG. 2C) and a second surface 32b, and a second substrate element 34a' can have a second height between a first surface 31 and a second surface 32b' that is different from the first height.

The first substrate 20, the substrate elements 34, and the mounting portions 35 of FIG. 1A can alternatively be a sectional view of the first substrate 20, the substrate elements 34b and 34b', and the mounting portions 35b of FIG. 6B, taken along the line C-C shown in FIG. 6B. In the variation shown in FIG. 6B, notches 33b can extend in transverse lateral directions H1 and H2 parallel to the first surface of the substrate 20, such that the mounting portions 35b can form portions of a mesh shape. In one embodiment, the mounting portions 35b can have a single common height T4 (FIG. 2C) between a first surface 31 (FIG. 2C) and a second surface 32b, which can be the height of the second substrate wafer 30 before the notches 33b are formed. In a particular embodiment, each individual substrate element 34b and 34b' can be disconnected from any other substrate element in the lateral directions H1 and H2. Similar to FIG. 6A, a first substrate element 34b can have a first height between a first surface 31 (FIG. 2C) and a second surface 32b, and a second substrate element 34b' can have a second height between a first surface 31 and a second surface 32b' that is different from the first height.

As shown in FIG. 6C, a substrate assembly 12c that can replace the substrate assembly 12 shown in FIG. 1A can be formed without the mounting portions 35 of FIG. 1A. In such an embodiment, notches 33c can be formed extending in transverse lateral directions H1 and H2 parallel to the first surface of the substrate 20 completely removing that material of the second substrate wafer 30 that extends between adjacent ones of the substrate elements 34c and 34c'. In a particular embodiment, each individual substrate element 34b and 34b' can be disconnected from any other substrate element in the lateral directions H1 and H2. Further processing of the substrate elements (as described with reference to FIG. 2L) can form substrate elements 34c and 34c' that have different heights from one another between a first surface 31 (FIG. 2C) and respective second surfaces 32b and 32b'.

As shown in FIG. 6D, a substrate assembly 12d that can replace the substrate assembly 12 shown in FIG. 1A can be formed with mounting portions 35d extending between adjacent portions 34d and 34d' of the second substrate wafer 30d. In such an embodiment, notches 33d can be formed extending around parts of the portions 34d and 34d'. In a particular embodiment, at least some of the portions 34d and 34d' of the second substrate wafer 30d can have different controlled thicknesses from one another between a first surface 31 (FIG. 2C) of the second substrate and respective second surfaces 32b and 32b' opposite therefrom. In one example, oppositely-facing adjacent edges 36 of adjacent portions 34d and 34d' can spaced apart from one another. In an exemplary embodiment, at least some of the first electrically conductive elements 23 (FIG. 1A) can be exposed between respective portions 34d and 34d'. In a particular embodiment, the mounting portions 35d shown in FIG. 6D can be combined with the mesh-shaped mounting portions 35a shown in FIG. 6A, such that mounting portions 35a and 35d can extend around and between adjacent portions of the second substrate wafer.

As shown in FIGS. 6E and 6F, a substrate assembly 12e that can replace the substrate assembly 12 shown in FIG. 1A can be formed with mounting portions 35e extending around and between adjacent portions 34e and 34e' of the second substrate wafer 30e. In such an embodiment, notches 33e can be formed extending through parts of the second substrate wafer 30e along one edge 36 of the portions 34e and 34e', thereby exposing parts of at least some of the conductive elements at the first surface of the first substrate 20 (such as the first conductive elements 23 shown in FIG. 1A) between respective portions 34e and 34e' for electrical connection with optoelectronic devices (such as the optoelectronic devices 14 shown in FIG. 1A) mounted on second surfaces of the respective portions through one or more wire bonds 44.

As can be seen in FIG. 6F, the mounting portions 35e can have a single common height T4 between a first surface 31 and a second surface 32a, which can be the height of the second substrate wafer 30 before the notches 33e are formed.

The substrate elements 34e and 34e' can have respective individual heights T5 and T5' between a first surface 31 and respective second surfaces 32b and 32b'. In one example, oppositely-facing adjacent edges 36 of adjacent portions 34e and 34e' can spaced apart from one another.

Figure 7A:
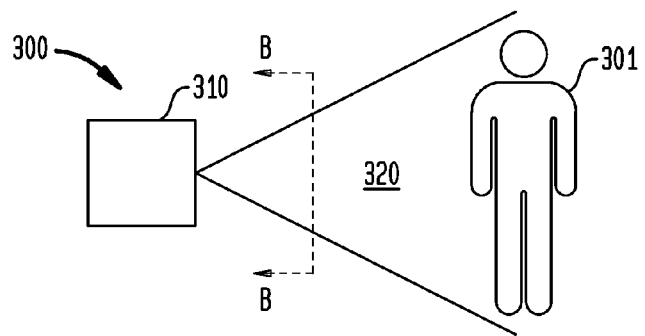
FIG. 7A is a schematic depiction of a system that can include a component according to the embodiments of the invention shown in FIG. 1A, 3, or 5.
Figure 7B:
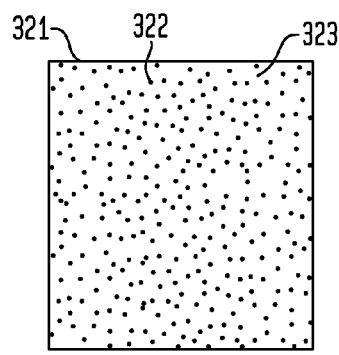
FIG. 7B is an optical output pattern that can be projected by a component according to the embodiments of the invention shown in FIG. 1A, 3, or 5.

FIG. 7A is a schematic depiction of a system that can include a component according to the embodiments of the invention shown in FIG. 1A, 3, 5, or 6A-6F. A consumer electronics system 300 has a component assembly 310 including a component according to any of the embodiments of the invention shown in FIG. 1A, 3, 5, or 6A-6F, a projector unit, a photodetector unit, and a microprocessor. The projector unit of the component assembly 310 can project a diverging refracted beam of energy 320 (e.g., infrared laser light) onto a human target 301. The photodetector unit of the component assembly 310 can receive energy reflected back from the human target 301, and the microprocessor can determine visual information about the position of the human target. FIG. 7B is a cross-section through the plane B-B of FIG. 7A that shows an example optical output pattern 321 of the refracted beam 320 that is projected by the component assembly 310. The optical output pattern 321 includes relatively light and dark areas 322 and 323 of the output pattern, and such a pattern can be produced by the refractive lens of the component according to FIG. 1A, 3, 5, or 6A-6F that can be included within the component assembly 310.

Figure 8:
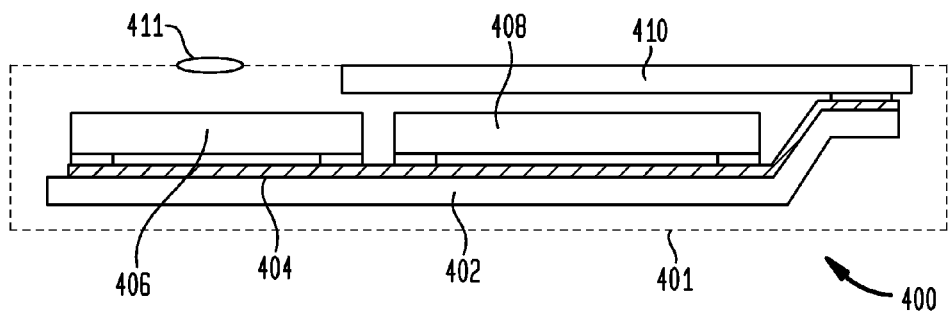
FIG. 8 is a schematic depiction of a system according to one embodiment of the invention.

The component assemblies described above can be utilized in construction of diverse electronic systems, as shown in FIG. 8. For example, a system 400 in accordance with a further embodiment of the invention includes a component assembly 406 as described above in conjunction with other electronic components 408 and 410. In the example depicted, component 408 is a semiconductor chip whereas component 410 is a display screen, but any other components can be used. Of course, although only two additional components are depicted in FIG. 8 for clarity of illustration, the system may include any number of such components. The microelectronic assembly 406 may be any of the assemblies described above. In a further variant, any number of such microelectronic assemblies may be used.

Component assembly 406 and components 408 and 410 are mounted in a common housing 401, schematically depicted in broken lines, and are electrically interconnected with one another as necessary to form the desired circuit. In the exemplary system shown, the system includes a circuit panel 402 such as a flexible printed circuit board, and the circuit panel includes numerous conductors 404, of which only one is depicted in FIG. 8, interconnecting the components with one another. However, this is merely exemplary; any suitable structure for making electrical connections can be used.

The housing 401 is depicted as a portable housing of the type usable, for example, in a cellular telephone or personal digital assistant, and screen 410 is exposed at the surface of the housing. Where structure 406 includes a light-sensitive element such as an imaging chip, a lens 411 or other optical device also may be provided for routing light to the structure. Again, the simplified system shown in FIG. 8 is merely exemplary; other systems, including systems commonly regarded as fixed structures, such as desktop computers, routers and the like can be made using the structures discussed above.

The openings and conductive elements disclosed herein can be formed by processes such as those disclosed in greater detail in the co-pending, commonly assigned U.S. patent application Ser. Nos. 12/842,587, 12/842,612, 12/842,651, 12/842,669, 12/842,692, and 12/842,717, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of fabricating a plurality of components using wafer-level processing, comprising:
   bonding first and second wafer-level substrates together to form a substrate assembly, such that first surfaces of the first and second substrates confront one another, the first substrate having first electrically conductive elements exposed at the first surface thereof;
   forming second electrically conductive elements contacting the first conductive elements, the second conductive elements extending through a thickness of the first substrate and being exposed at a second surface thereof opposite the first surface; and
   processing the second substrate into individual substrate elements, the processing including trimming material to produce the substrate elements at least some of which have respective different controlled thicknesses between first surfaces adjacent the first substrate and second surfaces opposite therefrom.

2. The method as claimed in claim 1, wherein each individual substrate element is disconnected from any other substrate element in lateral directions parallel to the first surface of the first substrate.

3. The method as claimed in claim 1, further comprising:
   mounting a plurality of optoelectronic devices onto the second surfaces of the respective substrate elements; and electrically connecting each optoelectronic device with at least one of the first conductive elements.

4. The method as claimed in claim 1, wherein the second substrate consists essentially of semiconductor material.

5. The method as claimed in claim 4, wherein the first substrate consists essentially of semiconductor material.

6. The method as claimed in claim 4, wherein the second substrate consists essentially of monocrystalline or polycrystalline silicon.

7. The method as claimed in claim 1, wherein the second substrate consists essentially of a material having a coefficient of thermal conductivity that is greater than 100 W/mK.

8. The method as claimed in claim 1, wherein at least two of said second conductive elements are available to simultaneously carry first and second different electric potentials, respectively.

9. The method as claimed in claim 1, wherein the step of processing the second substrate includes removing material from the second substrate such that at least one of the first conductive elements are at least partially exposed at the second surface of the second substrate for electrical interconnection with another element.

10. The method as claimed in claim 9, wherein the step of removing material from the second substrate includes forming notches extending through the second substrate and extending parallel to one another.

11. The method as claimed in claim 10, further comprising etching material exposed within the notches until said first conductive elements are at least partially exposed.

12. The method as claimed in claim 1, further comprising removing material from the first substrate to form at least one through hole extending between the first and second surfaces thereof, such that the step of forming the second conductive elements forms the second conductive elements extending within the at least one through hole.

13. The method as claimed in claim 12, wherein the step of removing material from the first substrate to form at least one through hole forms a first opening and a second opening within each through hole, the first opening extending from the first surface towards the second surface and the second opening extending from the first opening to the second surface.

14. The method as claimed in claim 13, wherein inner surfaces of the first and second openings extend in first and second directions relative to the first surface, respectively.

15. The method as claimed in claim 13, wherein the step of removing material from the first substrate to form at least one through hole forms a plurality of first openings including the first opening within each through hole, each of the plurality of first openings extending from the first surface to the second opening.

16. The method as claimed in claim 1, further comprising forming a ball grid array exposed at the second surface of the first substrate for electrical interconnection with one or more additional components external to the plurality of components, such that the ball grid array is electrically connected with the second conductive elements.

17. The method as claimed in claim 3, wherein each optoelectronic device includes a projector unit.

18. The method as claimed in claim 3, wherein each optoelectronic device includes a photodetector unit.

19. The method as claimed in claim 17, wherein each projector unit includes an optoelectronic emitter, a photodetector unit, and a reflective element.

20. The method as claimed in claim 17, wherein each projector unit includes at least one laser and at least one mirror.

21. The method as claimed in claim 3, further comprising assembling the substrate assembly with a wafer-level optical assembly having a plurality of optical units, each optical unit overlying a respective optoelectronic device of the plurality of optoelectronic devices.

22. The method as claimed in claim 21, wherein the wafer-level optical assembly includes a refractive wafer, and the step of assembling the substrate assembly with the optical assembly includes assembling at least one spacer extending between the substrate assembly and the optical assembly.

23. The method as claimed in claim 21, further comprising dicing the substrate assembly and the optical assembly to separate each of the plurality of components from one another, such that each of the plurality of components includes a respective part of each of the substrate assembly and the optical assembly.

24. The method as claimed in claim 23, wherein the step of dicing the substrate assembly and the optical assembly is performed such that each of the plurality of separated components includes at least a part of one of the second conductive elements extending along an edge surface of the first substrate extending between the first and second surfaces of the first substrate.

25. A method of fabricating a plurality of components using wafer-level processing, comprising:

bonding first and second wafer-level substrates together to form a substrate assembly, such that first surfaces of the first and second substrates confront one another, the first substrate having first electrically conductive elements exposed at the first surface thereof;

forming second electrically conductive elements contacting the first conductive elements, the second conductive elements extending through a thickness of the first substrate and being exposed at a second surface thereof opposite the first surface; and processing the second substrate to define a plurality of portions thereof, wherein at least some of the first electrically conductive elements are exposed between respective portions, wherein oppositely-facing adjacent edges of adjacent portions are spaced apart from one another, the processing including trimming material to produce the portions, at least some of which portions have respective different controlled thicknesses between first surfaces adjacent the first substrate and second surfaces opposite therefrom.

26. The method as claimed in claim 25, further comprising:
mounting a plurality of optoelectronic devices onto the second surfaces of the respective portions; and
electrically connecting each optoelectronic device with at least one of the first conductive elements.

27. The method as claimed in claim 25, wherein the second substrate consists essentially of semiconductor material.

28. The method as claimed in claim 27, wherein the first substrate consists essentially of semiconductor material.

29. The method as claimed in claim 27, wherein the second substrate consists essentially of monocrystalline or polycrystalline silicon.

30. The method as claimed in claim 25, wherein the second substrate consists essentially of a material having a coefficient of thermal conductivity that is greater than 100 W/mK.

31. The method as claimed in claim 25, wherein at least two of said second conductive elements are available to simultaneously carry first and second different electric potentials, respectively.

32. The method as claimed in claim 25, wherein the step of processing the second substrate includes removing material from the second substrate such that at least one of the first conductive elements are at least partially exposed at the second surface of the second substrate for electrical interconnection with another element.

33. The method as claimed in claim 32, wherein the step of removing material from the second substrate includes forming notches extending through the second substrate and extending parallel to one another.

34. The method as claimed in claim 33, further comprising etching material exposed within the notches until said first conductive elements are at least partially exposed.

35. The method as claimed in claim 25, further comprising removing material from the first substrate to form at least one through hole extending between the first and second surfaces thereof, such that the step of forming the second conductive elements forms the second conductive elements extending within the at least one through hole.

36. The method as claimed in claim 35, wherein the step of removing material from the first substrate to form at least one through hole forms a first opening and a second opening within each through hole, the first opening extending from the first surface towards the second surface and the second opening extending from the first opening to the second surface.

37. The method as claimed in claim 36, wherein inner surfaces of the first and second openings extend in first and second directions relative to the first surface, respectively.

38. The method as claimed in claim 36, wherein the step of removing material from the first substrate to form at least one through hole forms a plurality of first openings including the first opening within each through hole, each of the plurality of first openings extending from the first surface to the second opening.

39. The method as claimed in claim 25, further comprising forming a ball grid array exposed at the second surface of the first substrate for electrical interconnection with one or more additional components external to the plurality of components, such that the ball grid array is electrically connected with the second conductive elements.

40. The method as claimed in claim 26, wherein each optoelectronic device includes a projector unit.

41. The method as claimed in claim 26, wherein each optoelectronic device includes a photodetector unit.

42. The method as claimed in claim 40, wherein each projector unit includes an optoelectronic emitter, a photodetector unit, and a reflective element.

43. The method as claimed in claim 40, wherein each projector unit includes at least one laser and at least one mirror.

44. The method as claimed in claim 26, further comprising assembling the substrate assembly with a wafer-level optical assembly having a plurality of optical units, each optical unit overlying a respective optoelectronic device of the plurality of optoelectronic devices.

45. The method as claimed in claim 44, wherein the wafer-level optical assembly includes a refractive wafer, and the step of assembling the substrate assembly with the optical assembly includes assembling at least one spacer extending between the substrate assembly and the optical assembly.

46. The method as claimed in claim 44, further comprising dicing the substrate assembly and the optical assembly to separate each of the plurality of components from one another, such that each of the plurality of components includes a respective part of each of the substrate assembly and the optical assembly.

47. The method as claimed in claim 46, wherein the step of dicing the substrate assembly and the optical assembly is performed such that each of the plurality of separated components includes at least a part of one of the second conductive elements extending along an edge surface of the first substrate extending between the first and second surfaces of the first substrate.

* * * * *